US009357683B2

United States Patent
Liu et al.

(10) Patent No.: US 9,357,683 B2
(45) Date of Patent: May 31, 2016

(54) ELECTROMAGNETIC INTERFERENCE (EMI) SHIELDING APPARATUS INCLUDING ELECTRICALLY-CONDUCTIVE FOAM

(71) Applicant: Laird Technologies, Inc., Earth City, MO (US)

(72) Inventors: Ming Yueh Liu, New Taipei (TW);
Yi-Shen Lin, New Taipei (TW);
Jui-Iung Tsao, New Taipei (TW);
Ping-Feng Hsu, New Taipei (TW)

(73) Assignee: Laird Technologies, Inc., Earth City, MO (US)

( * ) Notice: Subject to any disclaimer, the term of this patent is extended or adjusted under 35 U.S.C. 154(b) by 0 days.

(21) Appl. No.: 14/513,557

(22) Filed: Oct. 14, 2014

(65) Prior Publication Data
US 2016/0095266 A1   Mar. 31, 2016

Related U.S. Application Data

(60) Provisional application No. 62/055,966, filed on Sep. 26, 2014.

(51) Int. Cl.
*H05K 9/00* (2006.01)

(52) U.S. Cl.
CPC .............. *H05K 9/0032* (2013.01); *H05K 9/003* (2013.01); *H05K 9/0037* (2013.01); *H05K 9/0081* (2013.01)

(58) Field of Classification Search
CPC ........................... H05K 9/0032; H05K 9/0037
USPC ........................................................ 174/387
See application file for complete search history.

(56) References Cited

U.S. PATENT DOCUMENTS

| 5,761,053 A * | 6/1998 | King | H01L 23/552 174/377 |
| 6,110,563 A * | 8/2000 | Pienimaa | H05K 3/284 156/278 |
| 6,309,742 B1 | 10/2001 | Clupper et al. | |
| 6,613,976 B1 * | 9/2003 | Benn, Jr. | H05K 9/0015 174/358 |
| 6,866,908 B2 | 3/2005 | Lichtenstein et al. | |
| 6,873,031 B2 | 3/2005 | McFadden et al. | |
| 7,326,862 B2 * | 2/2008 | Lionetta | H05K 9/0032 174/370 |

(Continued)

FOREIGN PATENT DOCUMENTS

JP    H04284697    10/1992

OTHER PUBLICATIONS

CF400-Series and CF-500 Series EcoFoam Conductive Foam; www.lairdtech.com; Copyright 2013; 2 pages.

(Continued)

*Primary Examiner* — Hung V Ngo
(74) *Attorney, Agent, or Firm* — Harness, Dickey & Pierce, P.L.C.

(57) ABSTRACT

According to various aspects, exemplary embodiments are disclosed of shielding apparatus or assemblies including electrically-conductive foam frames and covers or lids attachable to the frames. Also disclosed are exemplary embodiments of electrically-conductive foam frames for shielding apparatus or assemblies. Further, exemplary embodiments are disclosed of methods relating to making shielding apparatus or assemblies including electrically-conductive foam frames. Additionally, exemplary embodiments are disclosed of methods relating to providing shielding for one or more components on a substrate.

28 Claims, 10 Drawing Sheets

(56) References Cited

U.S. PATENT DOCUMENTS

| | | |
|---|---|---|
| 7,623,360 B2 | 11/2009 | English et al. |
| 8,213,180 B2 * | 7/2012 | Zhao .................. H01L 21/4878 165/104.33 |
| 2006/0272857 A1 | 12/2006 | Arnold |
| 2011/0162879 A1 | 7/2011 | Bunyan et al. |
| 2014/0093722 A1 * | 4/2014 | Sung .................... H05K 9/0088 428/336 |

OTHER PUBLICATIONS

86785 Nickel/Copper Fabric Tape; www.lairdtech.com; Copyright 2012; 2 pages.

* cited by examiner

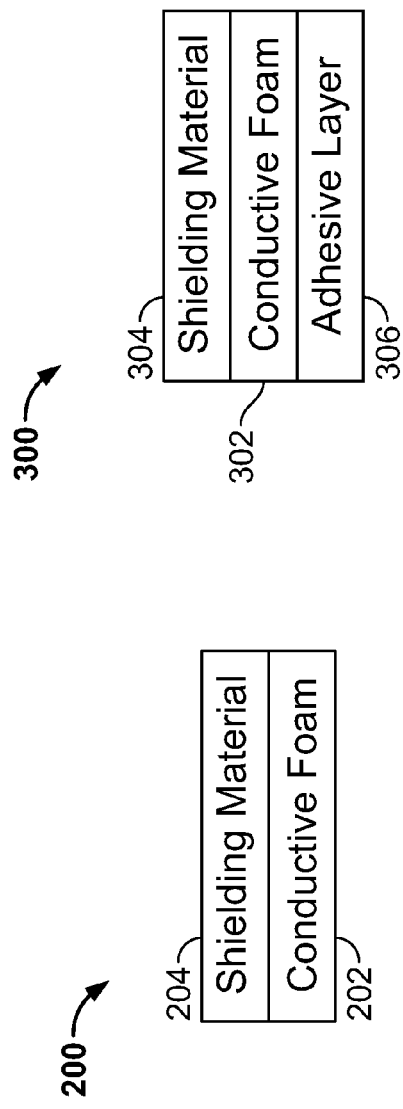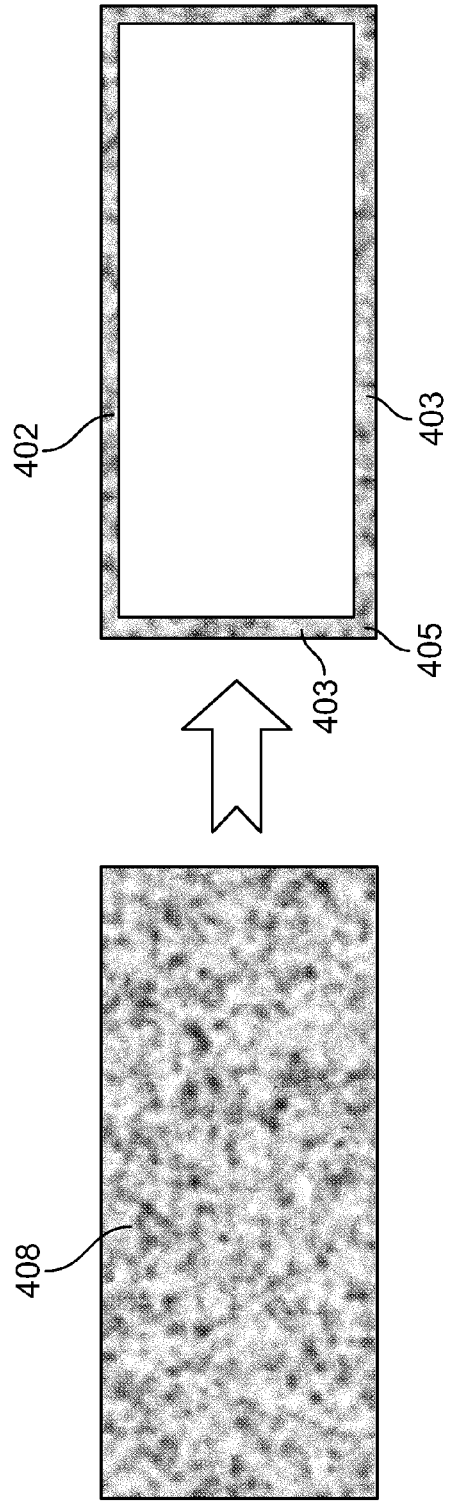
FIG. 4B
FIG. 4A
FIG. 5

US 9,357,683 B2

ELECTROMAGNETIC INTERFERENCE (EMI) SHIELDING APPARATUS INCLUDING ELECTRICALLY-CONDUCTIVE FOAM

CROSS REFERENCE TO RELATED APPLICATION

This application claims the benefit and priority of U.S. Provisional Application No. 62/055,966 filed Sep. 26, 2014. The entire disclosure of the above application is incorporated herein by reference.

FIELD

The present disclosure generally relates to EMI shielding apparatus or assemblies including electrically-conductive foam.

BACKGROUND

This section provides background information related to the present disclosure which is not necessarily prior art.

A common problem in the operation of electronic devices is the generation of electromagnetic radiation within the electronic circuitry of the equipment. Such radiation may result in electromagnetic interference (EMI) or radio frequency interference (RFI), which can interfere with the operation of other electronic devices within a certain proximity. Without adequate shielding, EMI/RFI interference may cause degradation or complete loss of important signals, thereby rendering the electronic equipment inefficient or inoperable.

A common solution to ameliorate the effects of EMI/RFI is through the use of shields capable of absorbing and/or reflecting and/or redirecting EMI energy. These shields are typically employed to localize EMI/RFI within its source, and to insulate other devices proximal to the EMI/RFI source.

The term "EMI" as used herein should be considered to generally include and refer to EMI emissions and RFI emissions, and the term "electromagnetic" should be considered to generally include and refer to electromagnetic and radio frequency from external sources and internal sources. Accordingly, the term shielding (as used herein) broadly includes and refers to mitigating (or limiting) EMI and/or RFI, such as by absorbing, reflecting, blocking, and/or redirecting the energy or some combination thereof so that it no longer interferes, for example, for government compliance and/or for internal functionality of the electronic component system.

SUMMARY

This section provides a general summary of the disclosure, and is not a comprehensive disclosure of its full scope or all of its features.

According to various aspects, exemplary embodiments are disclosed of shielding apparatus or assemblies including electrically-conductive foam frames and covers or lids attachable to the frames. Also disclosed are exemplary embodiments of electrically-conductive foam frames for shielding apparatus or assemblies. Further, exemplary embodiments are disclosed of methods relating to making shielding apparatus or assemblies including electrically-conductive foam frames. Additionally, exemplary embodiments are disclosed of methods relating to providing shielding for one or more components on a substrate.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIGS. 4A and 4B are diagrams illustrating layers of a shielding apparatus or assembly according to exemplary embodiments;

FIG. 5 shows an example method of making an electrically-conductive foam frame for a shielding apparatus or assembly by die-cutting a sheet of electrically-conductive foam according to exemplary embodiments;

Figure 14:
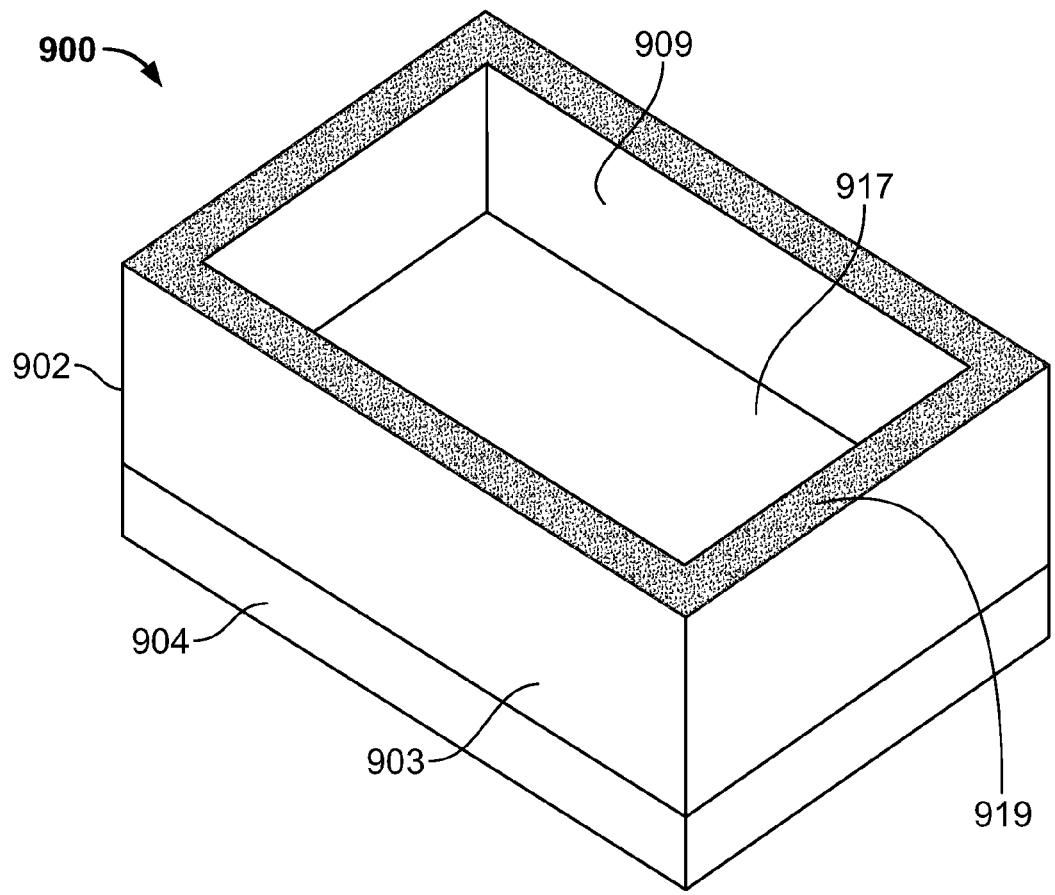
Figure 15:
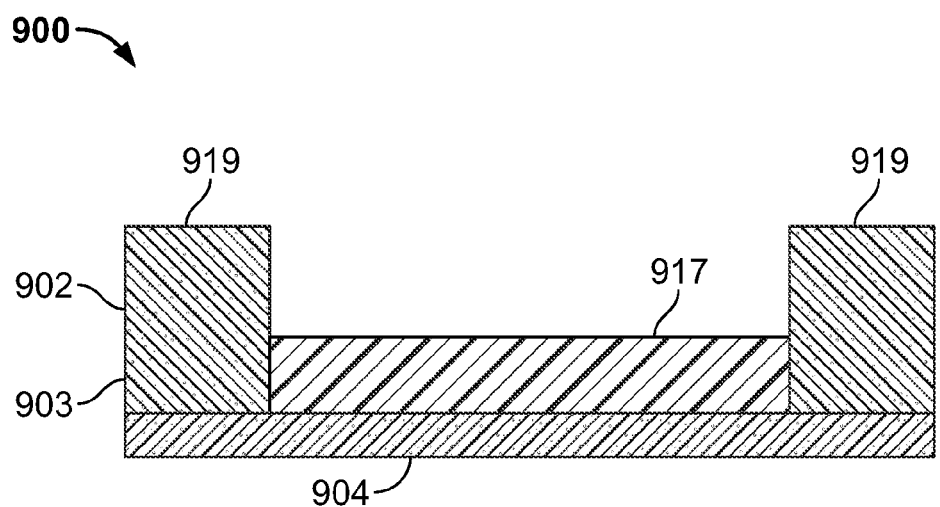

FIGS. 11A, 11B, 12, and 13 show another example method of making an electrically-conductive foam frame for a shielding apparatus or assembly according to exemplary embodiments;

FIG. 14 is a perspective view of a shielding apparatus including an electrically-conductive foam frame, a cover, and a thermal interface material along the cover according to an exemplary embodiment; and FIG. 15 is a cross-sectional view of the shielding apparatus shown in FIG. 14.

DETAILED DESCRIPTION

Example embodiments will now be described more fully with reference to the accompanying drawings.

Board level shielding (BLS) may be used in electronic devices, such as smartphones, tablets, etc. Traditional metal BLS assemblies are commonly used, but they need or require flatness. For example, a traditional metal-based BLS assembly may only be mounted on flat surfaces because of the lack of flexibility to bend and accommodate for tolerances in a surface that is not flat. It is also difficult for traditional metal BLS assemblies to have a height of one millimeter or less. Traditional metal BLS assemblies also cannot be applied or used in flexible PCB or wearable applications.

Another approach is to replace metal BLS with a fabric over foam (FOF) gasket. FOF gaskets may be arrayed as a wall of a BLS assembly, and then laminated using a pressure sensitive adhesive (PSA) with an electrically-conductive fabric layer as a top layer of the BLS assembly. The bottom of the BLS assembly will contact a printed circuit board (PCB) via an electrically-conductive PSA. But the inventors hereof have recognized that this FOF gasket approach can only be applied in rectangular shapes, as it is very difficult to adapt to non-rectangular shapes, and may have electromagnetic interference (EMI) leakage at corner joints.

In exemplary embodiments disclosed herein, there are BLS multipiece shielding apparatus or assemblies that include an electrically-conductive foam frame that may be applied to uneven surfaces, non-flat, and/or in various shapes or patterns (e.g., non-rectangular shapes, curved shapes, circular shapes, rectangular shapes, complicated patterns, etc.). Exemplary embodiments disclosed herein may have a height dimension of less than one millimeter, and/or may have sufficient flexibility to be applied in flexible PCB and wearable applications, etc. Also, exemplary embodiments disclosed herein may include a frame without any joints or gaps such that EMI leakage is reduced.

In an exemplary embodiment, a multipiece (e.g., two piece, etc.) shielding apparatus or assembly generally includes a frame and a cover or lid attachable to the frame. The frame comprises electrically-conductive foam. The cover or lid may comprise an EMI shielding material, surface, sheet, or layer (e.g., electrically-conductive fabric, metallized film, metal foil, other shielding materials, etc.). The cover may have a perimeter or footprint that is sized and shaped to match or correspond to a size and shape of the frame's perimeter or footprint. The cover may be attached along or to the upper surface of the frame so as to cover an open top of the frame. The multipiece shielding apparatus is operable for shielding one or more components on a substrate when the one or more components are within an interior cooperatively defined by the frame and the cover attached to the frame.

The frame may include one or more sidewalls defined by the electrically-conductive foam such that the frame has an open top. The cover may be coupled to the frame such that the open top of the frame is covered by the cover. The sidewalls may be integrally defined by a single piece of the electrically-conductive foam, such that the sidewalls have a single-piece or unitary construction. In which case, the frame would not include any gaps between adjacent pairs of the sidewalls that allow EMI leakage. The frame also would not include any joints connecting separate sidewalls to each other as the frame's sidewalls would be integrally connected to each other. The single piece of electrically-conductive foam may be die cut from an electrically-conductive foam sheet into a shape of the frame. Or, the frame may comprise a strip of the electrically-conductive foam bent into a shape of the frame.

In some exemplary embodiments, the frame may include one or more outer sidewalls and one or more interior walls, dividers, or partitions. The sidewalls and interior walls may all be defined by electrically-conductive foam. The cover and the frame's sidewalls and interior walls may cooperatively define a plurality of individual EMI shielding compartments. When the frame is installed (e.g., adhesively attached, soldered to soldering pads, etc.) to a substrate (e.g., printed circuit board, etc.), components on the substrate may be positioned in different compartments such that the components are provided with EMI shielding by virtue of the EMI shielding compartments inhibiting the ingress and/or egress of EMI into and/or out of each EMI shielding compartment. In other exemplary embodiments, the frame may not include or may be free of interior walls, dividers, or partitions such that the sidewalls of the frame generally define a single interior space or compartment. The shielding apparatus may comprise a two-piece assembly that includes a single-piece cover attachable to a single-piece frame.

The electrically-conductive foam may be any suitable electrically-conductive porous material, such as polyurethane open-cell foam, plated foam, etc. The electrically-conductive foam may comprise polyurethane foam plated with metal on a body of the polyurethane foam. The electrically-conductive foam may comprise foam that includes internal interstices having internal surfaces which are electrically conductive due to at least one electrically conductive metal or electrically-conductive non-metal layer disposed on the internal surfaces. In some embodiments, the lid or cover is also made of electrically-conductive foam, which may be the same as or different than the electrically-conductive foam used for the frame.

By way of example only, the electrically-conductive foam may be an EcoFoam Conductive Foam from Laird Technologies (e.g., CF400-Series, CF-500 Series, etc.). The electrically-conductive foam may provide X, Y and Z-axis conductivity and may enhance shielding effectiveness required for increasing microprocessor speeds of computers, telecommunications, other electronic equipment, etc. The foam may include an electrically-conductive PSA tape on one or more sides, or it may not include an adhesive. Also, by way of example only, the electrically-conductive PSA tape may be an electrically-conductive PSA tape from Laird Technologies, such as LT-301 PSA tape having a thickness of about 0.09 millimeters, a peel strength on stainless steel of greater than 1.3 kilogram force per 25 millimeters, and Z-axis resistance of less than 0.05 ohms.

The foam may be die-cut, hole-punched, notched, etc., and may be useful for unusually shaped applications which may be difficult to shield with profile gaskets. The foam may be used for low-cycling applications such as input/output (I/O) shielding, other non-shear standard connections, etc.

The electrically-conductive foam may be Restriction of Hazardous Substance (RoHS) compliant. The electrically-conductive foam may be halogen-free per the International Electrotechnical Commission (IEC) International Standard IEC 61249-2-21 (page 15, November 2003, First Edition). International Standard IEC 61249-2-21 defines "halogen free" (or free of halogen) for Electrical and Electronic Equipment Covered Under the European Union's Restriction of Hazardous Substances (RoHS) directive as having no more than a maximum of 900 parts per million chlorine, no more than a maximum of 900 parts per million bromine, and no more than a maximum of 1,500 parts per million total halogens. The phrases "halogen free," "free of halogen," and the like are similarly used herein.

The electrically-conductive foam may have excellent Z-axis electrical conductivity to provide effective EMI shielding and grounding, may allow for use of lighter materials using low compression forces, etc. The electrically-conductive foam may be used in any suitable application including servers, cabinet applications, network and telecommunication equipment, LCD and plasma television, medical equipment, desktop computers, printers, laptop computers, tablets, smartphones, etc. The electrically-conductive foam may be a metalized foam (e.g., a polyurethane foam plated with metal on a whole body of the polyurethane foam, etc.) and may have any suitable thickness, including about 0.5 millimeters (mm), about 1 mm, about 1.5 mm, about 2 mm, about 2.5 mm, about 3 mm, about 4 mm, etc. The shielding effectiveness of the electrically-conductive foam may be about 87 decibels (dB) between 30 Megahertz (MHz) and 300 MHz, about 108 dB between 300 MHz and 3 Gigahertz (GHz), and about 90 dB between 3 GHz and 18 GHz. The electrically-conductive foam may have a compression set less than 25% per ASTM D3574.

The cover may comprise an EMI shielding material, surface, sheet, or layer (e.g., electrically-conductive fabric, metallized film, metal foil, other electrically-conductive or shielding materials, etc.). The cover may have a perimeter or footprint that is sized and shaped to match or correspond to a size and shape of the frame's perimeter or footprint. The cover may include any suitable material including electrically-conductive fabric (e.g., tape, etc.), a metalized film, a metal foil, etc. For example, the electrically conductive material may include Nickel/Copper polyester conductive fabric tape from Laird Technologies (e.g., 86785 Nickel/Copper Fabric Tape, etc.). The electrically-conductive fabric tape may include a metalized (e.g., nickel, copper, etc.) polyester based fabric and an electrically-conductive pressure sensitive adhesive. The fabric layer may provide EMI/RFI shielding and electrical conductivity, while the adhesive layer may assist in applying the electrically-conductive fabric tape to metal, plastic, etc., surfaces. The electrically-conductive fabric tape may be produced on a roll, may be die-cut, hole-punched, etc.

The electrically-conductive material of the cover may be RoHS compliant, halogen-free per IEC-61249-2-21 standard, and have a low surface resistivity, e.g., less than about 0.1 ohms/square or other sufficiently low surface resistivity that provides excellent electrical conductivity. The electrically-conductive material of the cover may have a shielding effectiveness of greater than about 75 dB across a wide spectrum of frequencies (e.g., 75 decibels at 100 MHz, 80 dB at 1 GHz, etc.). The cover may include an electrically-conductive layer (e.g., metalized fabric, etc.), an adhesive layer (e.g., acrylic conductive pressure sensitive adhesive, etc.), and a release paper layer.

The cover or lid may be applied to the frame using adhesive. The cover or lid may have substantially the same shape as the frame so that the cover or lid will cover substantially all of a perimeter or open top defined by the frame. For example, the cover may be applied to a first side of the electrically-conductive foam frame to form a surface covering the open top of the frame and an interior defined by the frame. The interior defined by the frame may be substantially hollow, and may be covered by the cover such that the frame and cover may cooperatively provide shielding for components received within the interior cooperatively defined by the frame and cover.

In some embodiments, the electrically-conductive foam frame may be die-cut from an electrically-conductive foam sheet. This may produce an electrically-conductive foam frame that does not include any joints or gaps at the corners between two adjacent sidewalls. With traditional BLS frames, there may be joints or gaps at the corners where two separate sidewalls are joined together such that EMI may leak through the joints or gaps. The die-cut method may also produce conductive foam frames that have more complicated patterns (e.g., non-rectangular patterns, etc.).

In some embodiments, electrically-conductive foam may be cut into strips, and then bent into a pattern or shape of the frame. For example, one strip may be bent into an outer perimeter of the frame, and one or more other strips may be added as interior walls, partitions, or dividers. This approach may also reduce EMI leakage, as compared to FOF gaskets. The foam may be cut vertically (e.g., in a thickness direction) to form the frame.

The cover may be attached to a first side of the frame. An electrically-conductive pressure sensitive adhesive may be applied or coupled to a second side of the frame opposite the first side to which the cover is attached. The electrically-conductive pressure sensitive adhesive may be used to install the frame to a circuit board such that the shielding assembly provides board level shielding for one or more components of the circuit board. In other exemplary embodiments, the frame may be solderable to (e.g., soldering pads along or on, etc.) a substrate.

The shielding apparatus or assembly may have a two-dimensional shape or a three-dimensional shape. The shielding apparatus or assembly may be flexible, and may be configured to flexibly fit about one or more components of a circuit board to provide EMI shielding to the one or more components. For example, the electrically-conductive foam frame may be flexible enough to be applied to a circuit board having an uneven surface, irregular surface, curved surface, etc. The shielding apparatus or assembly may have an overall thickness or height of less than about one millimeter (e.g., about 0.75 mm, etc.).

In exemplary embodiments, at least a portion (e.g., lid or cover, etc.) of the shielding apparatus or assembly may also be thermally conductive to help establish or define at least a portion of a thermally-conductive heat path from a heat source (e.g., board-mounted heat generating electronic component of an electronic device, etc.) to a heat dissipating and/or heat removal structure, such as a heat sink, an exterior case or housing of an electronic device (e.g., cellular phone, smart phone, tablet, laptop, personal computer, etc.), heat spreader, heat pipe, etc.

For example, an exemplary embodiment includes a multipiece shielding apparatus or assembly that generally includes a frame and a cover or lid attachable to the frame. The cover or lid is electrically conductive and thermally conductive. For example, the cover may comprise foam that is electrically and thermally conductive, which foam may be the same or different than the foam used for the frame. One or more thermal interface materials may be disposed along an inner and/or outer surface of the cover or lid. For example, a thermal interface material (e.g., compliant or conformable thermal interface pad, putty, or gap filler, etc.) may be disposed along the inner surface of the cover or lid, such that the thermal interface material is placed in contact (e.g., direct physical contact, etc.) with at least one electrical component when the shielding apparatus is installed to a printed circuit board (PCB) over the at least one electrical component. By contacting the at least one electrical component, the thermal interface material can conduct heat away from the at least one electrical component to the cover or lid. The cover or lid may then conduct the heat to a heat dissipating device or heat removal structure. By way of example only, the shielding apparatus may be installed to the PCB using an electrically-conductive PSA tape between the frame and the PCB. Also, by way of example only, the thermal interface material may comprise a conformable and/or flowable thermal interface material having sufficient compressibility, flexibility, deformability, and/or flowability to allow the thermal interface material to relatively closely conform to the size and outer shape of the at least one electrical component, thereby removing air gaps therebetween. The thermal interface may also be a form-in-place material such that it can be dispensed in place onto the cover or lid of the shielding apparatus.

Figure 1:
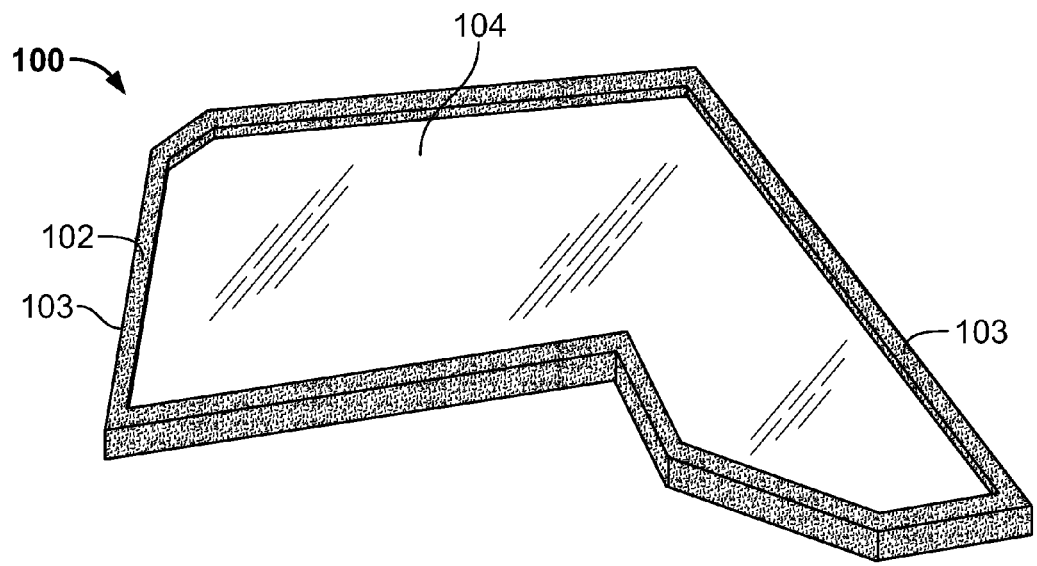
FIG. 1 is a perspective view of a shielding apparatus including a cover and an electrically-conductive foam frame according to an exemplary embodiment.
Figure 2:
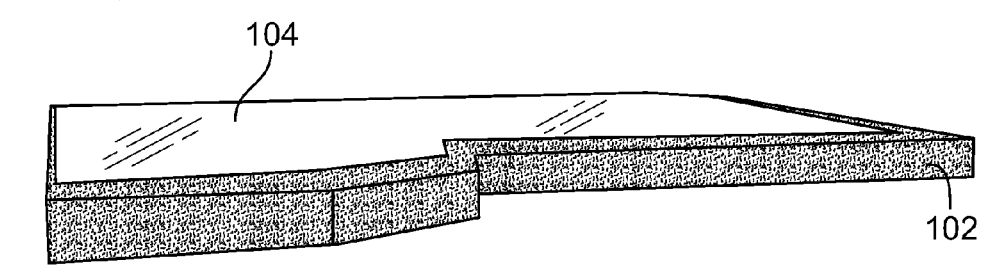
FIG. 2 is a perspective view of the shielding apparatus shown in FIG. 1, and illustrating the exterior of the cover and an electrically-conductive foam frame.
Figure 3:
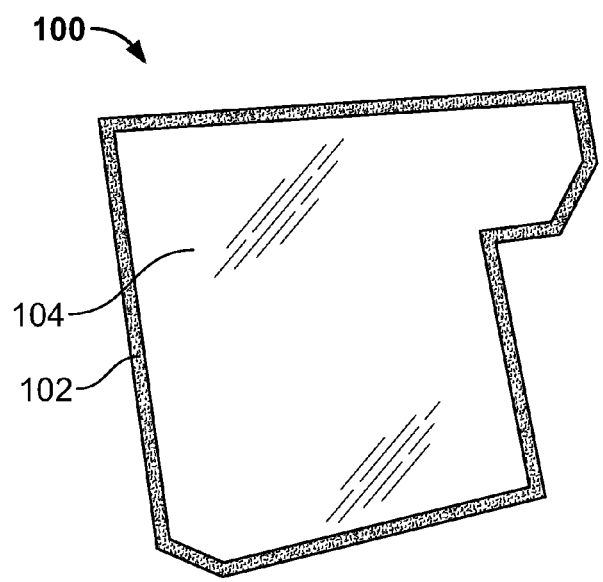
FIG. 3 is a plan view of the shielding apparatus shown in FIG. 1.

With reference to the figures, FIGS. 1-3 illustrate an exemplary embodiment of a shielding apparatus or assembly 100 according to aspects of the present disclosure. The assembly 100 includes a frame 102 and a cover or lid 104. The frame 102 includes an electrically-conductive foam. The electrically-conductive foam may be die-cut from a single electrically-conductive foam sheet, bent from one or more electrically-conductive foam strips, etc. Although FIGS. 1-3 illustrate the frame 102 in a non-regular, substantially two-dimensional shape, other exemplary embodiments may include an electrically-conductive foam frame having a different configuration, e.g., rectangular shape, other non-rectangular shapes (e.g., circular, triangular, irregular, etc.), three-dimensional shape, curved shapes, other patterns, etc.

The cover or lid 104 comprises a shielding surface in the form of an electrically-conductive fabric tape. In other embodiments, the cover 104 may comprise another shielding material, such as a metalized film, metal foil, etc. In still other embodiments, the cover 104 may comprise electrically-conductive foam, which is the same or different than the foam used for the frame 102.

The shielding apparatus or assembly 100 may have any suitable thickness or height, including about 2.25 mm, about 1 mm, about 0.75 mm, about 0.70 mm, etc. In some embodiments, the assembly 100 may include an electrically-conductive layer on top of the cover 104, such as electrically-conductive clear film or other material layer that has been metallized, laminated, or plated, etc.

In this illustrated embodiment, the shielding apparatus 100 is free of interior walls, dividers, or partitions such that the sidewalls 103 of the frame 102 generally define a single interior space or compartment. In other exemplary embodiments, an electrically-conductive foam frame may include one or more interior walls, dividers, or partitions (e.g., extending between and/or attached to sidewalls of the frame, etc.) for sectioning the frame into two or more interior spaces.

FIGS. 4A and 4B illustrate layers of example shielding apparatus or assemblies 200 and 300, respectively, according to exemplary embodiments. As shown in FIG. 4A, the shielding apparatus 200 includes electrically-conductive foam 202 (e.g., frame, etc.) and a shielding material 204 (e.g., cover or lid, etc.). The shielding material 204 may comprise an electrically-conductive fabric (e.g., electrically-conductive fabric tape, etc.), metallized film, metal foil, electrically-conductive foam, or other shielding materials, etc. The shielding material 204 may be coupled to a top side of the electrically-conductive foam 202. In exemplary embodiments, the electrically-conductive foam 202 is a frame having an open top, and the shielding material 204 is a cover or lid that is coupled to the frame to cover the open top. In such exemplary embodiments, the shielding apparatus or assembly 200 may thus be two-piece shielding apparatus where the first piece is the frame, and the second piece is the cover or lid.

As shown in FIG. 4B, the shielding apparatus 300 includes electrically-conductive foam 302 (e.g., frame, etc.), a shielding material 304 (e.g., cover or lid, etc.), and an adhesive layer 306 (e.g., a pressure sensitive adhesive, etc.). The shielding material 304 may comprise an electrically-conductive fabric (e.g., electrically-conductive fabric tape, etc.), metallized film, metal foil, electrically-conductive foam, or other shielding materials, etc. The shielding material 304 may be coupled to a top side of the electrically-conductive foam 302. The adhesive layer 306 may be coupled to a bottom side of the electrically-conductive foam 302. The adhesive layer 306 may be used for installing or mounting the shielding apparatus 300 to a substrate (e.g., printed circuit board, etc.). In exemplary embodiments, the electrically-conductive foam 302 is a frame having an open top, and the shielding material 304 is a cover or lid that is coupled to the frame to cover the open top.

FIG. 5 illustrates a method of die-cutting an electrically-conductive foam frame 402 from an electrically-conductive foam sheet 408. Although FIG. 5 shows a rectangular die-cut foam frame 402, other embodiments may have foam frames die-cut in different shapes. An electrically-conductive foam frame 402 may be die-cut into any desired shape based on the intended application or end use. For example, the frame 402 may be die-cut into non-rectangular shapes, irregular shapes (e.g., the frame shape shown in FIGS. 1-3), curved patterns, etc.

A die-cut foam frame 402 may inhibit EMI leakage because it may not have any joints or gaps at any corners 405 of the frame 402. For example, the frame 402 shown in FIG. 5 includes four sidewalls 403 and four corners 405. Each corner 405 is between a pair of adjacent sidewalls 403. The sidewalls 403 and corners 405 therebetween are integrally defined by the single piece of electrically-conductive foam that is die cut from the electrically-conductive sheet 408. Accordingly, the sidewalls 403 and corners 405 have a single-piece or unitary construction. The electrically-conductive foam frame 402 thus does not have any gaps between adjacent pairs of the sidewalls 403 that allow EMI leakage. The frame 402 also does not include any joints connecting separate sidewalls to each other as the frame's sidewalls 403 are integrally connected to each other at the corners 405.

In alternative example embodiments, a frame may be formed from one or more strips of electrically-conductive foam that is bent or otherwise formed or shaped in the shape of the frame. In some of these alternative embodiments, the frame includes only a single strip or piece of electrically-conductive foam that is shaped (e.g., bent, formed, etc.) to define the frame's one or more sidewalls. In other alternative embodiments, the frame includes multiple strips or pieces of electrically-conductive foam where one foam strip is shaped (e.g., bent, formed, etc.) to define the frame's outermost sidewalls and at least one other foam strip defining an interior wall, divider, or partition.

Figure 6A:
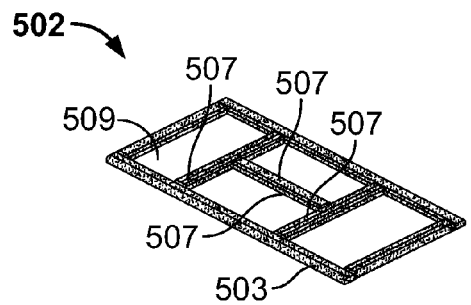
FIG. 6A is a perspective view of an electrically-conductive foam frame for a shielding apparatus or assembly according to an exemplary embodiment.

FIG. 6A illustrates an electrically-conductive foam frame 502 for a shielding apparatus or assembly according to an exemplary embodiment. As shown, the frame 502 includes four sidewalls 503 defining a rectangular shape. The frame 502 also includes three interior walls, dividers, or partitions 507 that cooperatively define four interior areas 509 separated by the interior walls 507. When a cover or lid is installed on top of the frame 502, the frame 502 and cover cooperatively define four separate EMI shielding compartments. When the frame 502 is installed to a substrate, components on the substrate may be positioned in different compartments such that the components are provided with EMI shielding by virtue of the EMI shielding compartments inhibiting the ingress and/or egress of EMI into and/or out of each EMI shielding compartment. The electrically-conductive foam frame 502 may include a fabric over foam material.

Figure 6C:
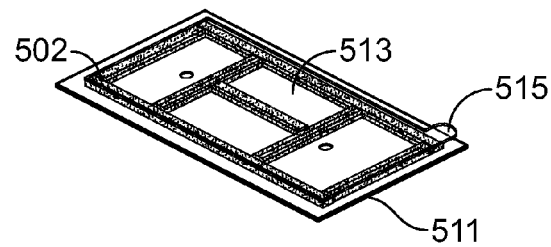
FIG. 6C is a perspective view of the electrically-conductive foam frame and liner shown in FIG. 6B, and also illustrating a layer of material (e.g., clear film, etc.) along a second side or top of the frame according to an exemplary embodiment.
Figure 6B:
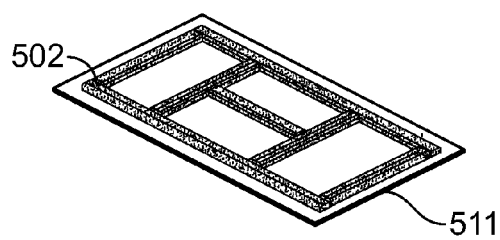
FIG. 6B is a perspective view of the electrically-conductive foam frame shown in FIG. 6A, and illustrating a layer of material (e.g., liner, etc.) along a first side or bottom of the frame according to an exemplary embodiment.

FIG. 6B illustrates the electrically-conductive foam frame 502 shown in FIG. 6A and a layer of material 511 along a first side or bottom of the frame 502 according to an exemplary embodiment. In this example, the layer of material 511 comprise a liner (e.g., electrically-conductive adhesive layer, etc.). The liner may be a full coverage extended release liner that allows for a single removal to expose the adhesive along the bottom of the frame 502. The exposed adhesive may then be used for adhesively attaching the frame 502 to a substrate.

FIG. 6C illustrates the electrically-conductive foam frame 502 and liner 511 shown in FIG. 6B. Also shown in FIG. 6C is another layer of material 513 along a second side or top of the frame 502 according to an exemplary embodiment. In this example, the layer of material 513 comprises a clear film or layer (e.g., Mylar® polyester film, other polyester film, polyimide (PI) film, polyethylene naphthalate (PEN) film, other transparent, semi-transparent, or translucent film, etc.) on a side of the electrically-conductive foam frame 502 opposite the liner 511. The clear film or layer may be a semi-transparent stiffener. The clear film or layer may include a low tack adhesive that will support the frame 502 and liner 511. For example, the frame 502 and liner 511 may be carried by a tab 515 until the frame 502 is installed to a substrate. The clear film or layer may also be removed or peeled off the frame 502 by using the tab 515 before or after the frame 502 is installed to a substrate.

FIGS. 7 through 10 illustrate an example method of assembling the bottom and top layers of material 511, 513 to the electrically-conductive foam frame 502 shown in FIGS. 6A, 6B, and 6C according to exemplary embodiments. This example method may be considered a semi-automated process. For example, an operator may have to manually perform one or more steps, such as putting the parts into a fixture or tool.

Figure 7:
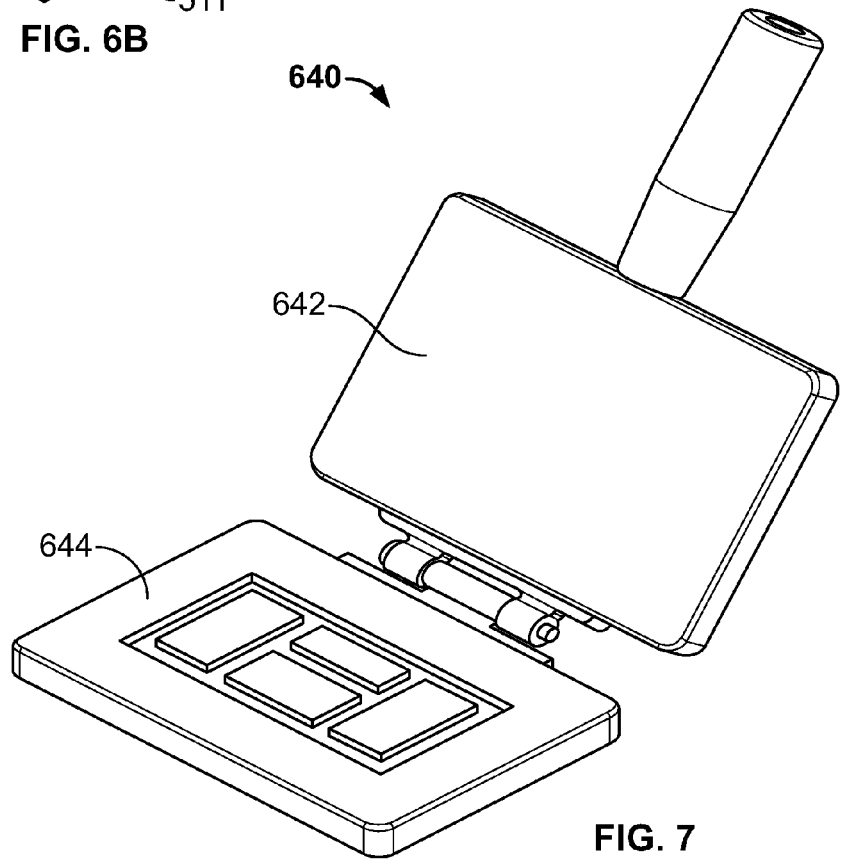
FIGS. 7 through 10 show an example method of assembling the layers of material to the electrically-conductive foam frame shown in FIGS. 6A, 6B, and 6C according to exemplary embodiments.

FIG. 7 shows the example fixture or tool 640 having a top vacuum board 642 and a bottom vacuum board 644. The fixture 640 may be used to first assemble the liner 511 on the electrically-conductive foam frame 502. For example, the bottom vacuum board 644 may be used to place the electrically-conductive foam frame 502. The top vacuum board 640 may be used for locating and catching up the liner 511.

Figure 8:
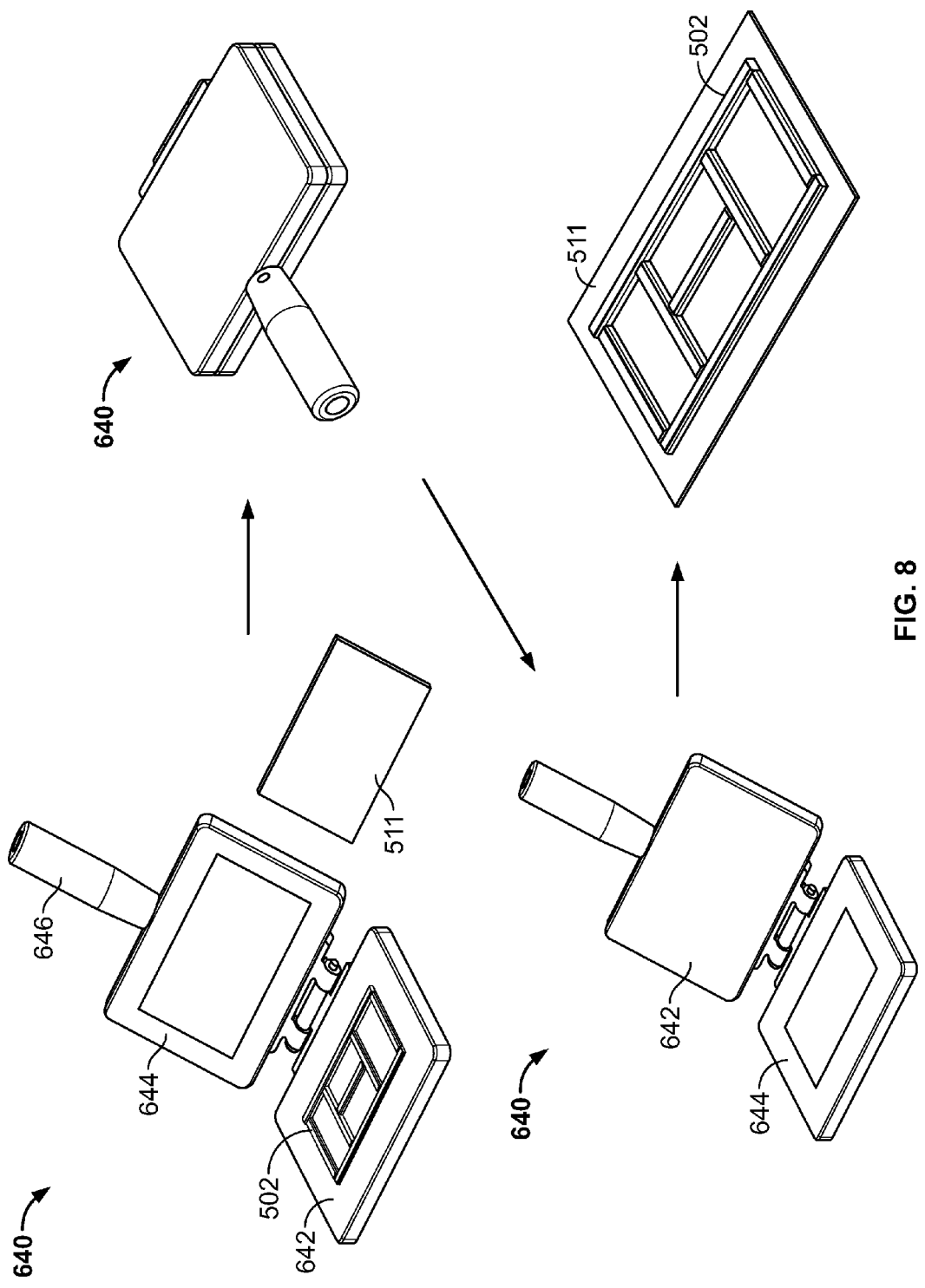

As shown in FIG. 8, an operator may manually place the liner 511 and the electrically-conductive foam frame 502 into the fixture or tool 640. The operator may then manually close the fixture or tool 640 via the handle 646, to thereby cause the liner 511 to stick or adhere to the electrically-conductive foam frame 502. The liner 511 may be applied to the electrically-conductive foam frame 502 using any suitable adhesive (e.g., pressure sensitive adhesive, etc.). The operator may then manually open the fixture or tool 640 and remove the electrically-conductive foam frame 502 and liner 511 coupled to the electrically-conductive foam frame 502. By way of example only, an operator may be able to assemble about one piece per minute using this tool or fixture 640.

Figure 9:
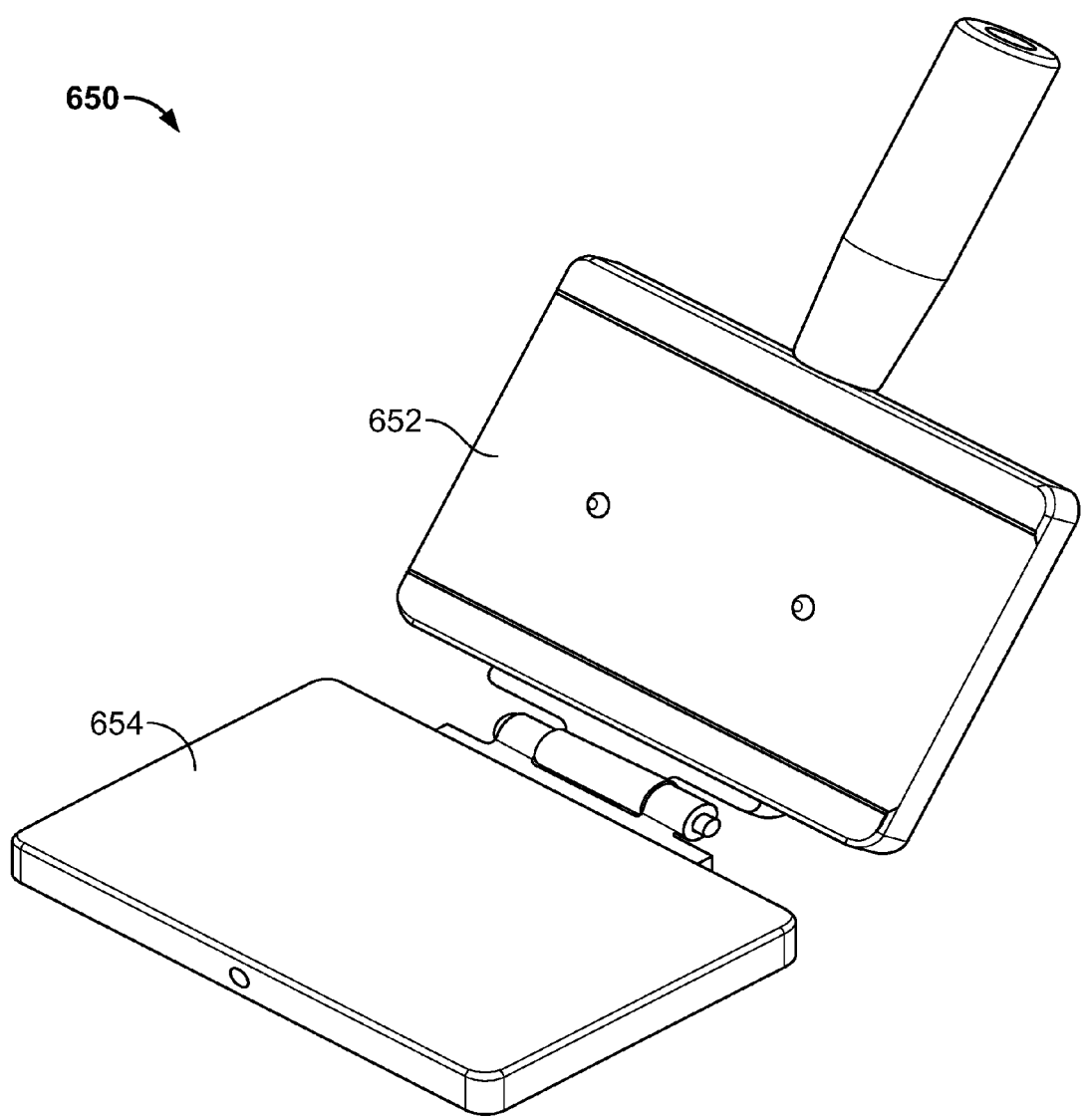

FIG. 9 illustrates another example fixture of tool 650 having a top vacuum board 652 and a bottom vacuum board 654. The fixture 650 may be used to assemble the layer 513 on the side of the electrically-conductive foam frame 502 opposite the liner 511. For example, the bottom vacuum board 652 may be used for locating and catching up the electrically-conductive foam frame 502 and liner 511. The top vacuum board 652 may be used for locating and catching up the layer 513. As shown, the top vacuum board 652 includes locating pins for locating and aligning the layer 513, which has corresponding holes for receiving the pins.

Figure 10:
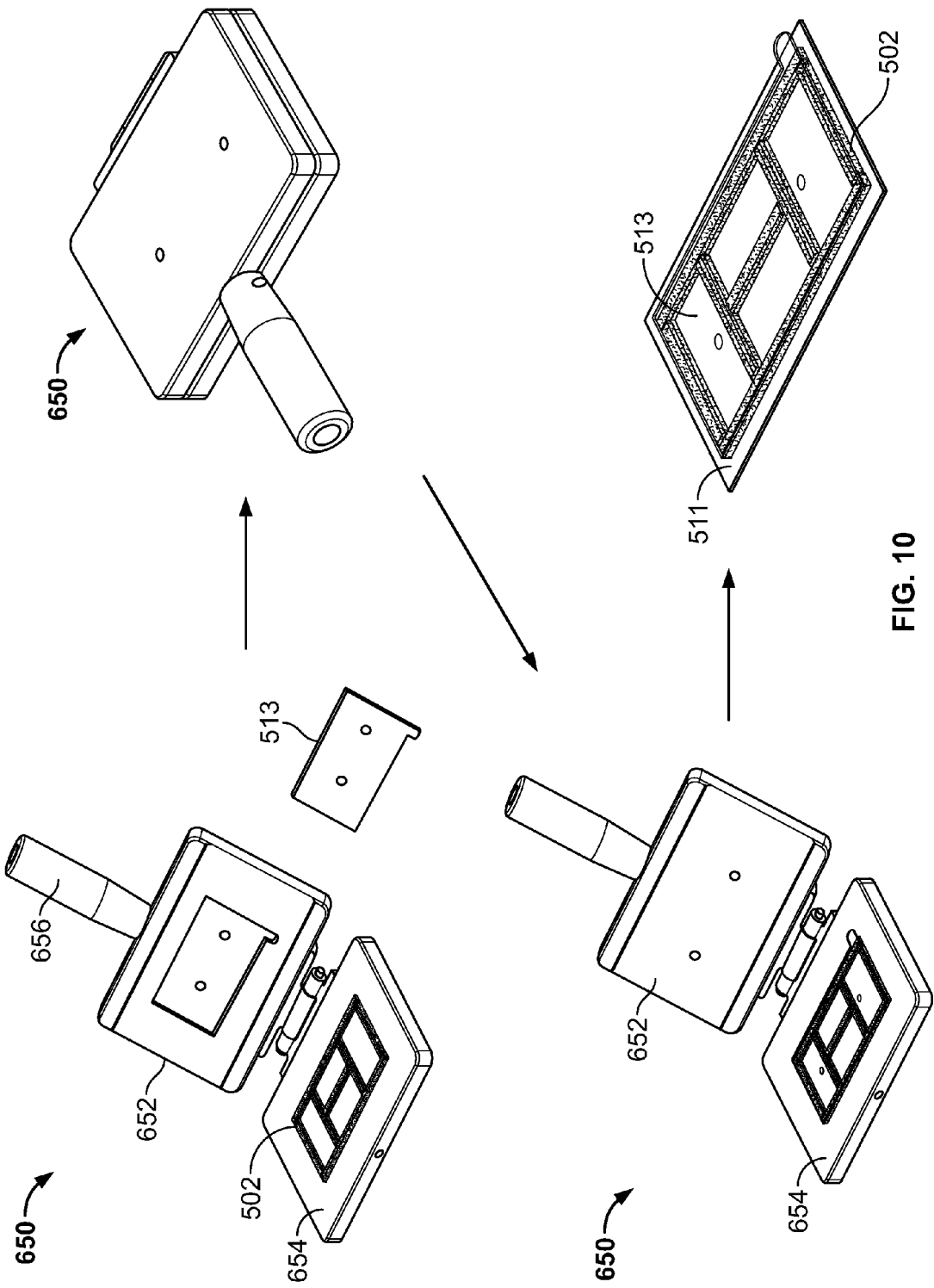

As shown in FIG. 10, an operator may manually place the layer 513 and the electrically-conductive foam frame 502 and liner 511 into the fixture or tool 650. The operator may then manually close the fixture or tool 650 via the handle 656, to thereby cause the layer 513 to stick to the side of the electrically-conductive foam frame 502 opposite the liner 511. The layer 513 may be applied to the electrically-conductive foam frame 502 using any suitable adhesive (e.g., pressure sensitive adhesive, etc.). The operator may then manually open the fixture or tool 650 and remove the electrically-conductive foam frame 502 and the liner 511 and layer 513 coupled to the opposite sides of the electrically-conductive foam frame 502. By way of example only, an operator may be able to assemble about six pieces per minute using the tool or fixture 650.

FIGS. 11A, 11B, 12, and 13 illustrate another example method of making an electrically-conductive foam frame 704 for a shielding apparatus or assembly according to exemplary embodiments. The example method may be considered an automated process. For example, an operator may only need to manually place materials in the machine, and the machine may automatically complete the remainder of the process without any additional manual steps required of the operator.

Figure 11A:
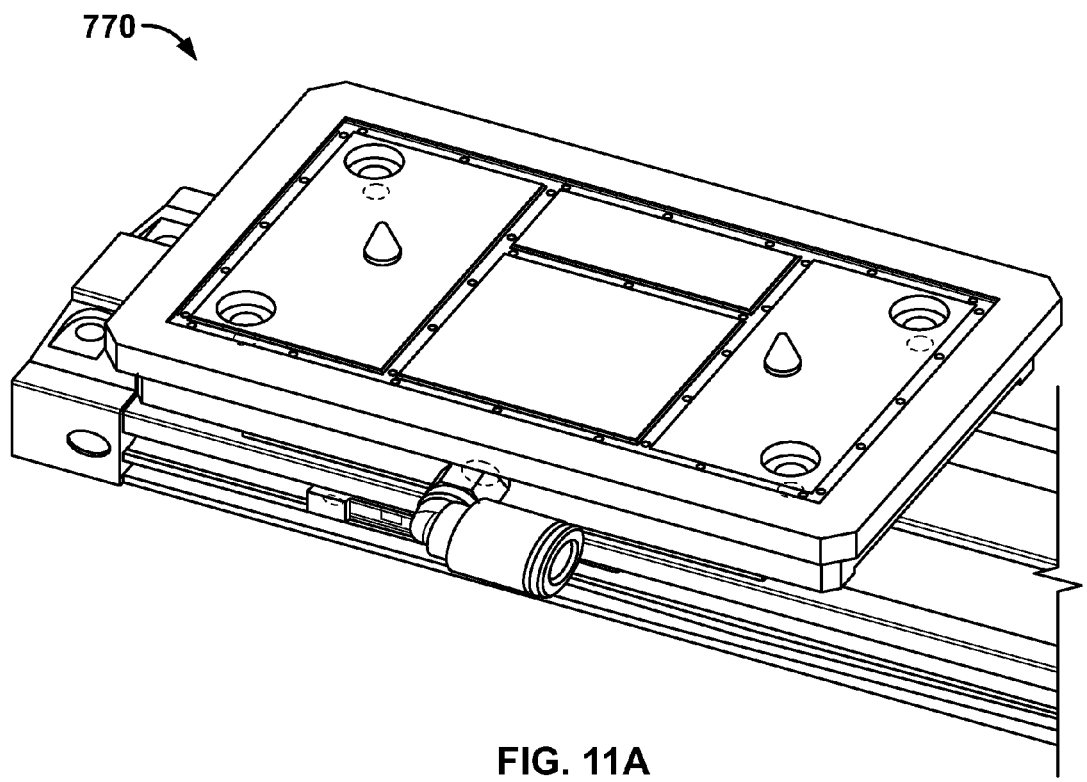
Figure 11B:
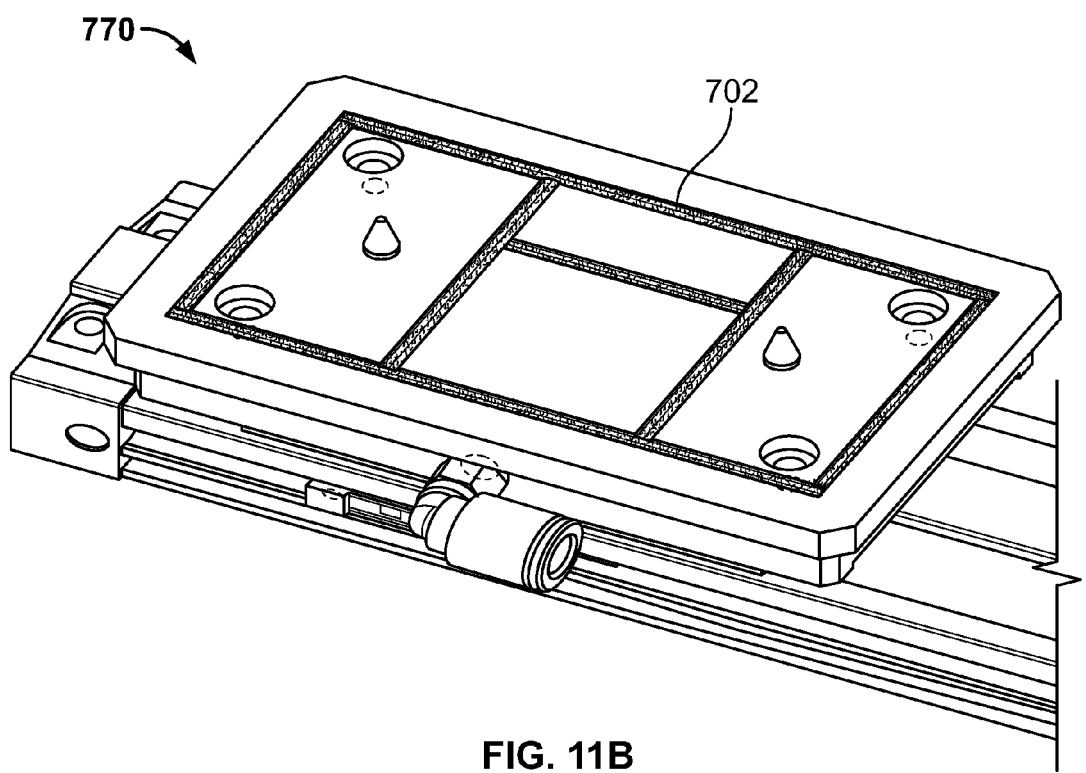

FIGS. 11A and 11B show a vacuum nest 770. In FIG. 11A, the vacuum nest 770 is open. In FIG. 11B, the vacuum nest 770 is populated (e.g., with electrically-conductive foam materials for the frame 704, etc.). In some embodiments, the vacuum nest 770 may be populated manually by an operator. The vacuum nest 770 may be a stereolithography (SLA) printed vacuum nest.

Figure 12:
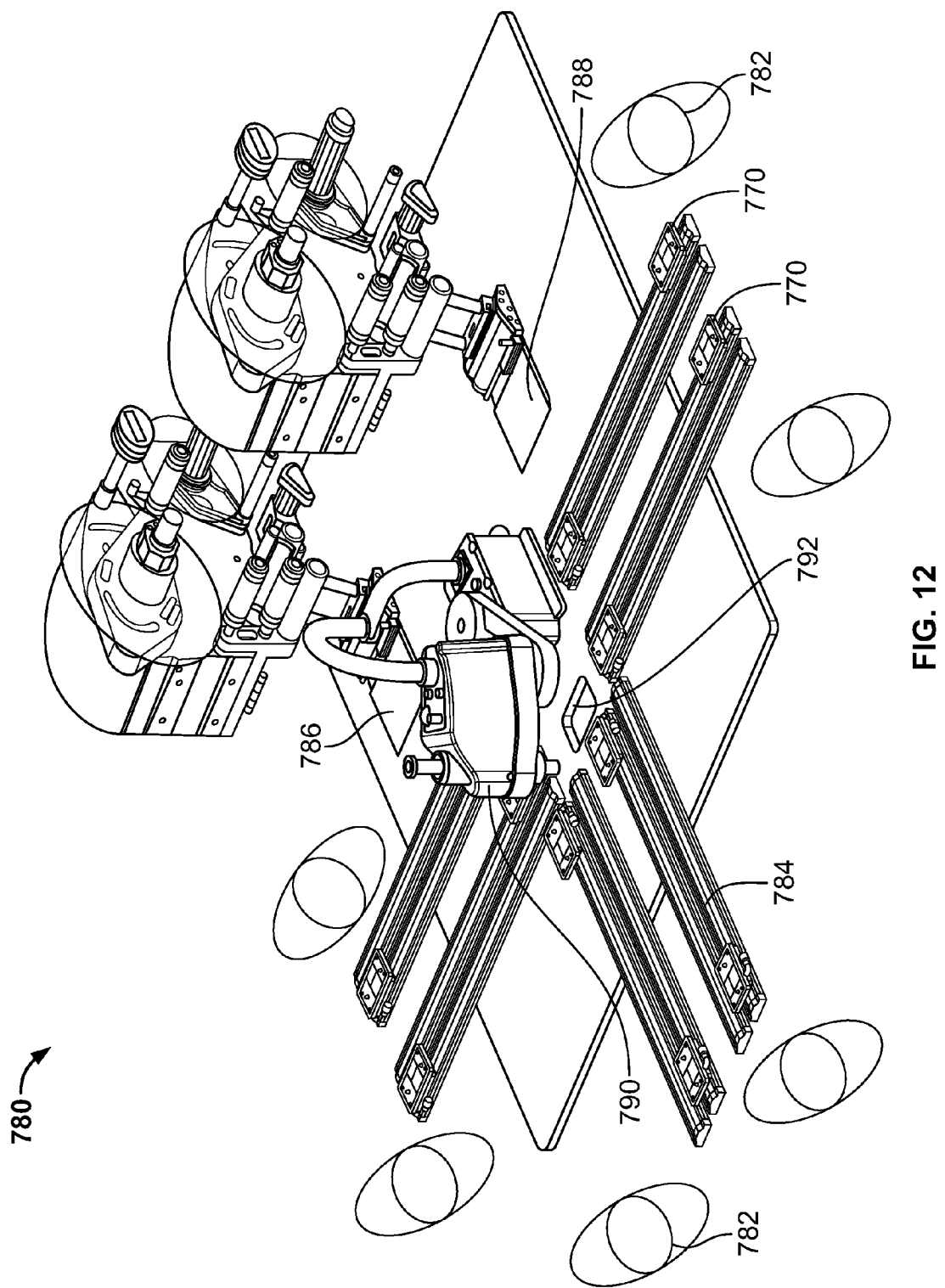

FIG. 12 shows an example assembly machine or system 780 for automated production of electrically-conductive foam frames 704. Operators 782 may manually load electrically-conductive foam over fabric frames in vacuum nests 770 located on tracks 784. For example, the machine 780 may include six tracks 784 such that six operators 782 may use the machine 780 at one time. Other embodiments may include more or less tracks 784 and have more or less operators 782 working at one time.

The assembly machine 780 may include a clear film or layer applicator 786, e.g., an applicator for applying Mylar® polyester film, other polyester film, polyimide (PI) film, polyethylene naphthalate (PEN) film, other transparent, semi-transparent, or translucent film, etc. For example, the applicator 786 may be a suitable Mylar® polyester film applicator, including an Avery ALS-204 Applicator with a converter roll, etc. The applicator 786 may be configured to apply a semi-transparent stiffener to an electrically-conductive foam frame.

The assembly machine 780 may also include a release liner applicator 788. The release liner applicator 788 may be any suitable release liner applicator, including an Avery ALS-204 Applicator with a converted roll, etc. The release liner applicator 788 may be configured to apply a full coverage extended release liner to an electrically-conductive foam frame.

The machine 780 may also include a robot 790, which may be configured to label capture. Registration for the stiffener layer may occur at placement via locating pins (e.g., of the robot 790, the vacuum nest 770, the applicator 786, etc.). The tacked assembly may then be mated with the full coverage release liner (e.g., via the release liner applicator 788, the robot 790, the vacuum nest 770, etc.). A tamp operation may be performed to assure proper adhesion of the electrically-conductive foam frame, liner, and clear film layer (e.g., Mylar® polyester film, other polyester film, polyimide (PI) film, polyethylene naphthalate (PEN) film, other transparent, semi-transparent, or translucent film, etc.). Completed assemblies may then pass through cutout 792. Although FIG. 12 illustrates six operators 782, six tracks 784, and one each of the clear film or layer applicator 786, release liner applicator 788, and robot 790, more or less operators and/or machine components may be used in other embodiments.

By way of example only, the assembly machine 780 may be capable of producing about 1200 parts per hour with six operators working on an 18 second load time. This would create a cycle time of about three seconds per cycle, or about 0.33 parts per second, 20 parts per minute, and 1,200 parts hour. With a 100% yield and an up-time of 70%, the machine 780 may be capable of producing 840 net parts per hour. With two shifts per day of ten hours per shift, the machine 780 may be capable of producing 16,800 net parts per day and 100,800 net parts per week when operated six days a week.

Figure 13:
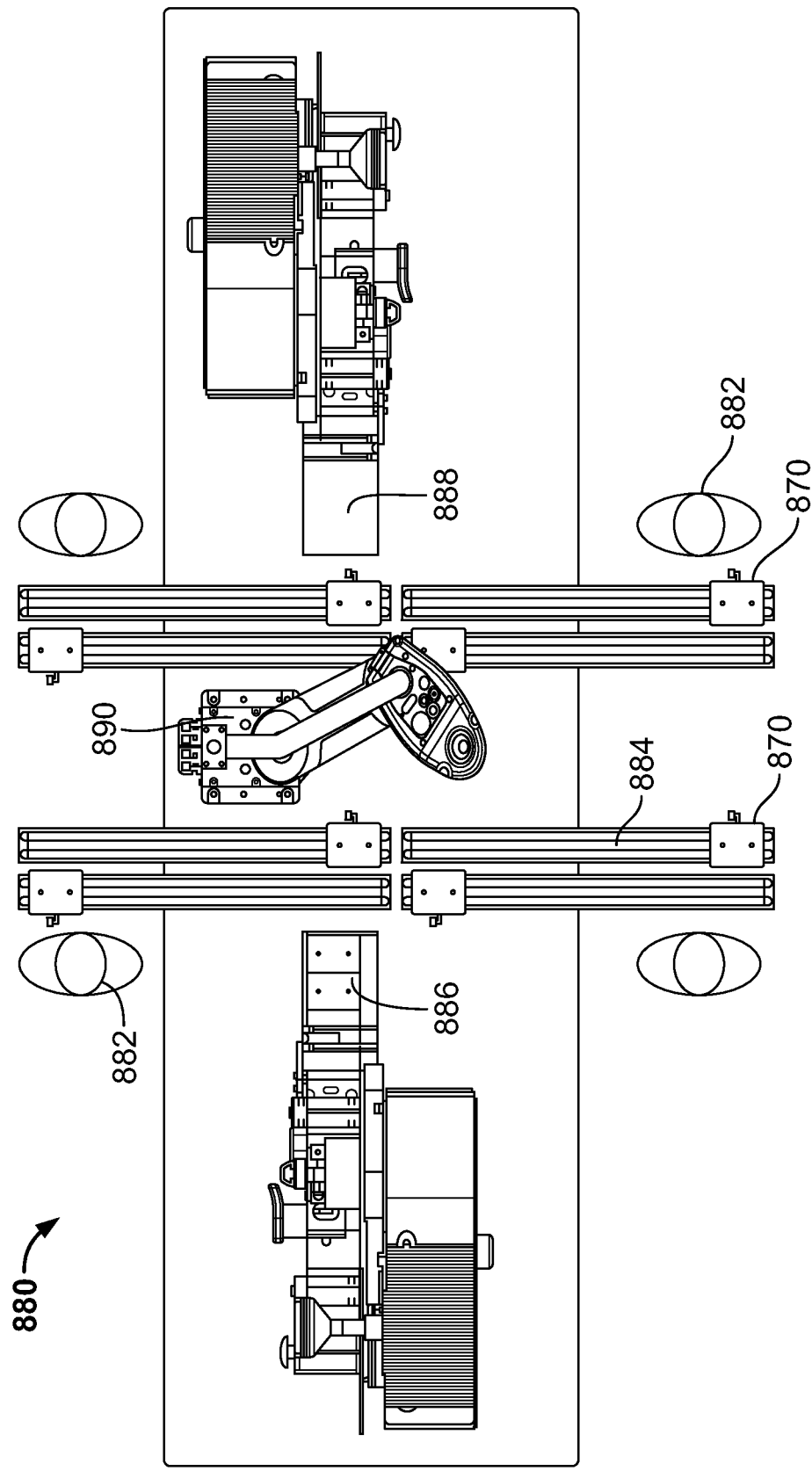

FIG. 13 illustrates another example assembly machine or system 880. The machine 880 includes eight tracks 884, each having a vacuum nest 870, which may be used by operators 882. The machine 880 also includes a clear film or layer applicator 886, and a release liner applicator 888, and a robot

890. The machine 880 may be configured to assemble electrically-conductive foam frame assemblies in a similar manner to the machine 780 of FIG. 13. Although FIG. 13 illustrates four operators 882, eight tracks 884, and one each of the clear film or layer applicator 886, release liner applicator 888, and robot 890, more or less operators and/or machine components may be used in other embodiments.

By way of example only, with four operators and an 18 second load time, the machine 880 may be capable of producing about 800 parts per hour. For example, with a cycle time of 4.5 seconds per cycle, the machine 880 may produce 0.22 parts per second, 13.3 parts per minute, and therefore 800 parts per hour. With a 100% yield and 70% up-time, 560 net parts per hour may be produced. With two shifts a day at ten hours each for six days a week, 11,200 net parts may be produced per day, 67,200 net parts per week, 291,000 net parts per month, and 873,000 net parts per quarter.

With a 36 second load time, the machine 880 may be capable of producing about 400 parts per hour. For example, with a cycle time of 9 seconds per cycle, the machine 880 may produce 0.11 parts per second, 6.7 parts per minute, and therefore 400 parts per hour. With a 100% yield and a 70% up-time, 280 net parts per hour may be produced. With two shifts of ten hours each a day for six days a week, 5,600 net parts may be produced per day, 33,600 net parts per week, 145,600 net parts per month, and 436,800 net parts per quarter.

FIGS. 14 and 15 illustrates another exemplary embodiment of a shielding apparatus of assembly 900 according to aspects of the present disclosure. The assembly 900 includes a frame 902 and a cover or lid 904. In this illustrated example, the assembly 900 also includes a thermal interface material 917 disposed along a surface of the cover 904.

The frame 902 comprises electrically-conductive foam. The electrically-conductive foam may be die-cut from a single electrically-conductive foam sheet, bent from one or more electrically-conductive foam strips, etc. By way of example only, the frame 902 may comprise EcoFoam Conductive Foam from Laird Technologies (e.g., CF400-Series, CF-500 Series, etc.).

In this example, the cover or lid 904 also comprises electrically-conductive foam, which may be the same or different than the electrically-conductive foam used for the frame 904. By way of example only, the cover 904 may comprise Eco-Foam Conductive Foam from Laird Technologies (e.g., CF400-Series, CF-500 Series, etc.). In other embodiments, the cover 904 may comprise another shielding material, such as a metalized film, metal foil, electrically-conductive fabric tape, etc. In some embodiments, the assembly 900 may include a cover 904 comprising an electrically-conductive clear film or other material layer that has been metallized, laminated, or plated, etc.

In this illustrated embodiment, the shielding apparatus 900 is free of interior walls, dividers, or partitions such that the sidewalls 903 of the frame 902 generally define a single interior space or compartment 909. In other exemplary embodiments, an electrically-conductive foam frame may include one or more interior walls, dividers, or partitions (e.g., extending between and/or attached to sidewalls of the frame, etc.) for sectioning the frame into two or more interior spaces.

Also in this illustrated embodiment, electrically-conductive PSA tape 919 is along the bottom of the frame's sidewalls 903. The PSA tape 919 may be used to adhesively attach the frame 902 to a substrate, e.g., PCB, etc. By way of example only, the electrically-conductive PSA tape may be an electrically-conductive PSA tape from Laird Technologies, such as LT-301 PSA tape having a thickness of about 0.09 millimeters, a peel strength on stainless steel of greater than 1.3 kilogram force per 25 millimeters, and Z-axis resistance of less than 0.05 ohms. Alternative embodiments may include other adhesives or no adhesive along the frame's sidewalls.

The thermal interface material 917 is disposed along the inner surface of the cover 904. The thermal interface material 917 and cover 904 may help establish or define at least a portion of a thermally-conductive heat path from a heat source (e.g., board-mounted heat generating electronic component of an electronic device, etc.) to a heat dissipating and/or heat removal structure, such as a heat sink, an exterior case or housing of an electronic device (e.g., cellular phone, smart phone, tablet, laptop, personal computer, etc.), heat spreader, heat pipe, etc. The thermal interface material 917 may be adhesively attached to the cover 904 and/or friction fit between the frame's sidewalls 903, etc. Or, for example, the thermal interface material 917 may be self-adherent or sufficiently tacky to allow the thermal interface material 917 to be disposed along the cover 904 without requiring any adhesive.

The thermal interface material 917 may comprise a compliant, conformable, and/or flowable thermal interface pad, putty, or gap filler, etc. The thermal interface material 917 may have sufficient compressibility, flexibility, and/or flowability to allow the thermal interface material 917 to relatively closely conform to the size and outer shape of an electrical component to thereby remove air gaps therebetween when the shielding apparatus 900 is installed to a PCB over the electrical component. By contacting the electrical component, the thermal interface material 917 can conduct heat away from the electrical component to the cover 904. The cover 904 may then conduct the heat to a heat dissipating and/or heat removal structure that is adjacent or in contact with the cover 904. Additionally, the thermal interface material 917 may comprise a form-in-place material such that the thermal interface material 917 may be dispensed in place onto the cover 904.

By way of example only, the frame 902 may comprise a rectangular shape having a length of 50 mm, a width of 20 mm, and a thickness or height from 1.5 mm to 2.0 mm (e.g., 1.5 mm, 1.75 mm, 2.0 mm, etc.). Each frame sidewall 903 may have a width of 1.0 mm, such that the frame's opening or interior 909 comprises a rectangular shape having a length of 48 mm and a width of 18 mm. The cover 904 may have the same or similar rectangular shape, length and width dimensions (e.g., 50 mm×20 mm, etc.) as the frame 902. The cover 904 may have a thickness or height of 0.5 mm. The thermal interface material 917 may have the same or similar rectangular shape, length, and width dimensions (e.g., 48 mm×18 mm, etc.) as the opening or interior 909 of the frame 902. The thermal interface material 917 may have a thickness or height of 1.0 mm. The PSA tape 919 along the frame's sidewalls 903 may have a thickness of about 0.09 mm. In this example, the shielding apparatus or assembly 900 may have any overall total thickness or height from about 2mm to about 2.6 mm (e.g., 2 mm, 2.09mm, 2.59 mm, 2.6 mm, etc.). The dimensions and shapes provided in this paragraph (as are all dimensions and shapes disclosed herein) are examples only. Other exemplary embodiments may be configured differently, e.g., to have a different shape (e.g., non-rectangular, etc.) and/or to be sized smaller or larger, etc.

According to another exemplary embodiment, a method of making a board level EMI shielding apparatus or assembly generally includes forming an electrically-conductive foam frame, and substantially covering a first side of the electrically-conductive foam frame with an electrically-conductive material to form a shielding surface having a perimeter corresponding to a shape of the frame. Forming the electrically-conductive foam frame may include die-cutting the frame from an electrically-conductive foam sheet, or cutting an electrically-conductive foam into one or more electrically-conductive foam strips and bending at least one of the electrically-conductive foam strips into a frame.

The exemplary method may further include applying an electrically-conductive pressure sensitive adhesive to a second side of the frame. The electrically-conductive pressure sensitive adhesive may be applied to a circuit board, thereby attaching the electrically-conductive foam frame and shielding surface to the circuit board to provide shielding to one or more components of the circuit board. The electrically-conductive foam assembly may be flexed to adapt the electrically-conductive foam frame and shielding surface to a curved, non-flat, and/or irregular surface of a circuit board, wearable item, etc.

According to another exemplary embodiment, a method of making a multipiece shielding apparatus generally includes forming electrically-conductive foam walls that define an open top and that are configured for installation to a substrate generally about one or more components on a substrate. The method also includes covering the open top with an electrically-conductive material. The electrically-conductive foam walls and the electrically-conductive material are operable for shielding the one or more components on the substrate when the one or more components are within an interior cooperatively defined by the electrically-conductive foam walls and the electrically-conductive material.

The electrically-conductive foam walls may be formed by die-cutting the electrically-conductive foam walls from a single electrically-conductive foam sheet such that the electrically-conductive foam walls have a single-piece or unitary construction. Or, for example, the electrically-conductive foam walls may be formed by cutting an electrically-conductive foam into one or more electrically-conductive foam strips and bending at least one of the one of the electrically-conductive foam strips into the electrically-conductive foam walls.

An electrically-conductive pressure sensitive adhesive may be applied to a first side of the electrically-conductive foam walls that is opposite to a second side of the electrically-conductive foam walls along which the electrically-conductive material is positioned to cover the open top. The electrically-conductive pressure sensitive adhesive may be used to attach the electrically-conductive foam walls to a circuit board about one or more components on the circuit board, to thereby provide shielding to the one or more components of the circuit board. The electrically-conductive foam walls and electrically-conductive material may be flexed to correspond with a curved, non-flat, and/or irregular surface of the circuit board.

The method may include using vacuum nests or vacuum boards for attaching the electrically-conductive material to the electrically-conductive foam walls over the open top. The method may also include forming one or more electrically-conductive foam interior walls such that the electrically-conductive foam walls, the one or more electrically-conductive foam interior walls, and the electrically-conductive material cooperatively define a plurality of individual EMI shielding compartments. Components on a substrate may be positionable in different compartments and be provided with EMI shielding by virtue of the EMI shielding compartments inhibiting the ingress and/or egress of EMI into and/or out of each EMI shielding compartment.

According to another exemplary embodiment, a method relating to providing shielding for one or more components on a substrate generally includes attaching a cover to a frame that comprises electrically-conductive foam. The method also includes attaching the frame to the substrate such that the one or more components are disposed within an interior cooperatively defined by the frame and the cover.

According to another exemplary embodiment, there is a frame for a multipiece shielding apparatus for use in providing EMI shielding for one or more components on a substrate. The frame comprises electrically-conductive foam sidewalls that define an open top of the frame. The sidewalls are configured for installation to a substrate generally about the one or more components on the substrate.

The sidewalls may be integrally defined by a single piece of electrically-conductive foam, such that the sidewalls have a single-piece or unitary construction. The single piece of electrically-conductive foam may be die cut from an electrically-conductive foam sheet into a shape of the frame or bent into a shape of the frame.

The frame may also comprise one or more electrically-conductive foam interior walls. The frame's sidewalls and interior walls may cooperatively define a plurality of areas separated from each other by one or more of the electrically-conductive foam interior walls.

The electrically-conductive foam sidewalls may comprise polyurethane foam plated with metal and/or a foam that includes internal interstices having internal surfaces which are electrically conductive due to at least one electrically conductive metal or non-metal layer disposed on the internal surfaces.

A multipiece shielding apparatus may include the frame and a cover attached to the frame over the open top of the frame. The multipiece shielding apparatus is operable for shielding the one or more components on the substrate when the one or more components are within an interior cooperatively defined by the frame and the cover.

In exemplary embodiments, the electrically-conductive foam used for the frame may undergo a flame retardant treatment. For example, the internal surfaces of the foam or porous material may be provided with an effective amount of a flame retardant. The flame retardant may be dispersed throughout the foam by being disposed on the surfaces of the interconnected interstices (or pores). In the context of the present disclosure, an "effective amount" may be considered as an amount of the flame retardant that provides the foam with at least horizontal flame rating of UL94 V-0, V-1, V-2, HB, or HF-1, while at the same time retaining a Z-axis conductivity or bulk resistivity sufficient for EMI shielding applications. The amount of the flame retardant dispersed throughout the foam may be about 10 ounces per square yard (opsy) or less, about 5 opsy or less, about 3 opsy, etc. By way of example only, the flame retardant treatment may be similar or identical to a flame retardant coating process described in U.S. Pat. No. 7,060,348 and/or U.S. Patent Application Publication 2014/0199904 by which the electrically-conductive foam may be UL94 V-0 and halogen free. The entire disclosures of U.S. Pat. No. 7,060,348 and U.S. Patent Application Publication 2014/0199904 are incorporated herein by reference.

In embodiments that include one or more thermal interface materials (e.g., shielding apparatus 900 shown in FIGS. 14 and 15, etc.), a wide variety of materials may be used for any of the one or more thermal interface materials (TIMs) in those exemplary embodiments. For example, the one or more TIMs may be formed from materials that are better thermal conductors and have higher thermal conductivities than air alone. The one or more TIMs may comprise thermal interface materials from Laird Technologies (e.g., Tflex™ 300 series thermal gap filler materials, Tflex™ 600 series thermal gap filler materials, Tpcm™ 580 series phase change materials, Tpcm™ 780 series phase change materials Tpli™ 200 series gap fillers, and/or Tgrease™ 880 series thermal greases, etc.).

By way of further example, a TIM may be molded from thermally-conductive and electrically-conductive elastomer. The TIMs may comprise thermally-conductive compliant materials or thermally conductive interface materials formed from ceramic particles, metal particles, ferrite EMI/RFI absorbing particles, metal or fiberglass meshes in a base of rubber, gel, grease or wax, etc.

The tables below list example TIMs and properties. These example TIMs are commercially available from Laird Technologies, and, accordingly, have been identified by reference to trademarks of Laird Technologies. These tables are provided for purposes of illustration only and not for purposes of limitation.

| Name | Construction Composition | Type | Thermal Conductivity [W/mK] | Thermal Impedance [° C.-cm²/W] | Pressure of Thermal Impedance Measurement [kPa] |
|---|---|---|---|---|---|
| T-flex ™ 620 | Reinforced boron nitride filled silicone elastomer | Gap Filler | 3.0 | 2.97 | 69 |
| T-flex ™ 640 | Boron nitride filled silicone elastomer | Gap Filler | 3.0 | 4.0 | 69 |
| T-flex ™ 660 | Boron nitride filled silicone elastomer | Gap Filler | 3.0 | 8.80 | 69 |
| T-flex ™ 680 | Boron nitride filled silicone elastomer | Gap Filler | 3.0 | 7.04 | 69 |
| T-flex ™ 6100 | Boron nitride filled silicone elastomer | Gap Filler | 3.0 | 7.94 | 69 |
| T-pli ™ 210 | Boron nitride filled, silicone elastomer, fiberglass reinforced | Gap Filler | 6 | 1.03 | 138 |
| T-pcm ™ 583 | Non-reinforced film | Phase Change | 3.8 | 0.12 | 69 |
| T-flex ™ 320 | Ceramic filled silicone elastomer | Gap Filler | 1.2 | 8.42 | 69 |
| T-grease ™ 880 | Silicone-based based grease | Thermal Grease | 3.1 | 0.138 | 348 |

The tables herein list various TIMs that have thermal conductivities of 1.2, 3, 3.1, 3.8, 4.7, 5.4, and 6 W/mK. These thermal conductivities are only examples as other embodiments may include a TIM with a thermal conductivity higher than 6 W/mK, less than 1.2 W/mK, or other values between 1.2 and 6 W/mk. For example, a TIM may be used that has a thermal conductivity higher than air's thermal conductivity of .024 W/mK, such as a thermal conductivity of about 0.3 W/mk, of about 3.0 W/mK, or somewhere between 0.3 W/mk and 3.0 W/mk, etc.

| | Tflex ™ 620 | Tflex ™ 640 | Tflex ™ 660 |
|---|---|---|---|
| Construction & Composition | Reinforced boron nitride filled silicone elastomer | Boron nitride filled silicone elastomer | Boron nitride filled silicone elastomer |
| Color | Blue-Violet | Blue-Violet | Blue-Violet |
| Thickness | 0.020* (0.51 mm) | 0.040* (1.02 mm) | 0.060* (1.52 mm) |
| Thickness Tolerance | ±0.003* (±0.08 mm) | ±0.004* (±0.10 mm) | ±0.006* (±0.15 mm) |
| Density | 1.38 g/cc | 1.34 g/cc | 1.34 g/cc |
| Hardness | 40 Shore 00 | 25 Shore 00 | 25 Shore 00 |
| Tensile Strength | N/A | 15 psi | 15 psi |
| % Elongation | N/A | 75 | 75 |
| Outgassing TML (Post Cured) | 0.13% | 0.13% | 0.13% |
| Outgassing CVCM (Post Cured) | 0.05% | 0.05% | 0.05% |
| UL Flammability Rating | UL 94 V0 | UL 94 V0 | UL 94 V0 |
| Temperature Range | −45° C. to 200° C. | −45° C. to 200° C. | −45° C. to 200° C. |
| Thermal Conductivity | 3 W/mK | 3 W/mK | 3 W/mK |
| Thermal Impedance @ 10 psi | 0.46° C. · in²/W | 0.62 C. · in²/W | 0.85 C. · in²/W |
| @ 69 KPa | 2.97° C. · cm²/W | 4.00 C. · cm²/W | 5.58 C. · cm²/W |
| Thermal Expansion | 600 ppm/° C. | 430 ppm/° C. | 430 ppm/° C. |
| Breakdown Voltage | 3,000 Volts AC | >5,000 Volts AC | >5,000 Volts AC |
| Volume Resistivity | $2 \times 10^{13}$ ohm · cm | $2 \times 10^{13}$ ohm · cm | $2 \times 10^{13}$ ohm · cm |

-continued

| | | | |
|---|---|---|---|
| Dielectric Constant @ 1 MHz | 3.31 | 3.31 | 3.31 |

| | Tflex ™ 680 | Tflex ™ 6100 | TEST METHOD |
|---|---|---|---|
| Construction & Composition | Boron nitride filled silicone elastomer | Boron nitride filled silicone elastomer | |
| Color | Blue-Violet | Blue-Violet | Visual |
| Thickness | 0.080* (2.03 mm) | 0.100* (2.54 mm) | |
| Thickness Tolerance | ±0.008* (±0.20 mm) | ±0.10* (±0.25 mm) | |
| Density | 1.34 g/cc | 1.34 g/cc | Helium Pycnometer |
| Hardness | 25 Shore 00 | 25 Shore 00 | ASTM D2240 |
| Tensile Strength | 15 psi | 15 psi | ASTM D412 |
| % Elongation | 75 | 75 | ASTM D412 |
| Outgassing TML (Post Cured) | 0.13% | 0.13% | ASTM E595 |
| Outgassing CVCM (Post Cured) | 0.05% | 0.05% | ASTM E595 |
| UL Flammability Rating | UL 94 V0 | UL 94 V0 | E180840 |
| Temperature Range | −45° C. to 200° C. | −45° C. to 200° C. | ASTM D5470 (modified) |
| Thermal Conductivity | 3 W/mK | 3 W/mK | |
| Thermal Impedance @ 10 psi @ 69 KPa | 1.09 C.·in$^2$/W 7.04 C.·cm$^2$/W | 1.23 C.·in$^2$/W 7.94 C.·cm$^2$/W | ASTM D5470 (modified) |
| Thermal Expansion | 430 ppm/° C. | 430 ppm/° C. | IPC-TM-650 2.4.24 |
| Breakdown Voltage | >5,000 Volts AC | >5,000 Volts AC | ASTM D149 |
| Volume Resistivity | $2 \times 10^{13}$ ohm·cm | $2 \times 10^{13}$ ohm·cm | ASTM D257 |
| Dielectric Constant @ 1 MHz | 3.31 | 3.31 | ASTM D150 |

| PROPERTIES | |
|---|---|
| Color | Grey |
| Density | 2.73 g/cc |
| Viscosity Brookfield Viscometer | <1,500,000 cps TF spindle at 2 rpm (helipath) and 23° C. |
| Temperature Range | −40-150° C. (−40-302° F.) |
| UL Flammability Rating | 94 V0. File E180840 |
| Thermal Conductivity | 3.1 W/mk |

-continued

| PROPERTIES | |
|---|---|
| Thermal Resistance | |
| @ 10 psi | 0.014° C.-in$^2$/W (0.090° C.-cm$^2$/W) |
| @ 20 Psi | 0.010° C.-in$^2$/W (0.065° C.-cm$^2$/W) |
| @ 50 psi | 0.009° C.-in$^2$/W (0.058° C.-cm$^2$/W) |
| Volume Resistivity (ASTM D257) | $9 \times 10^{13}$ Ohm-cm |

| Typical Property | Description | Test Method |
|---|---|---|
| Color | Grey | Visual |
| Construction/Composition | Non-reinfored film | |
| Specific Gravity, g/cc | 2.51 | Helium Pycnometer |
| Minimum bond line thickness, mm (mils) | 0.025 (1) | Laird Test Method |
| Thermal conductivity, W/mk | 4.7 | Hot Disk Thermal Constants Analyzer |
| Thermal Resistance ° C.cm$^2$/W (° C.in$^2$/W) | 0.064 (0.010) | ASTM D5470 |
| Available Thickness, mm (mils) | 0.125-0.625 (5-25) | Laird Test Method |
| Room Temperature Hardness, shore 00 | 85 | ASTM D2240 |
| Volume Resistivity, ohm-cm | $10^{15}$ | ASTM D257 |

| SPECIFICATIONS | | | | |
|---|---|---|---|---|
| PROPERTIES | Tpcm ™ 583 | Tpcm ™ 585 | Tpcm ™ 588 | Tpcm ™ 5810 |
| Construction & composition | Non-reinforced film | | | |
| Color | Gray | | | |
| Thickness | 0.003" (0.076 mm) | 0.005" (0.127 mm) | 0.008" (0.2 mm) | 0.010" (0.25 mm) |
| Density | 2.87 g/cc | | | |
| Operating temperature range | −40° C. to 125° C. (−40° C. to 257° F.) | | | |
| Phase change softening temperature | 50° C. (122° F.) | | | |
| Thermal resistance | | | | |
| 10 psi | 0.019° C.-in$^2$/W (0.12° C.-cm$^2$/W) | 0.020° C.-in$^2$/W (0.13° C.-cm$^2$/W) | 0.020° C.-in$^2$/W (0.13° C.-cm$^2$/W) | 0.020° C.-in$^2$/W (0.13° C.-cm$^2$/W) |
| 20 psi | 0.016° C.-in$^2$/W (0.10° C.-cm$^2$/W) | 0.016° C.-in$^2$/W (0.10° C.-cm$^2$/W) | 0.016° C.-in$^2$/W (0.10° C.-cm$^2$/W) | 0.016° C.-in$^2$/W (0.10° C.-cm$^2$/W) |
| 50 psi | 0.013° C.-in$^2$/W (0.08° C.-cm$^2$/W) | 0.013° C.-in$^2$/W (0.08° C.-cm$^2$/W) | 0.013° C.-in$^2$/W (0.08° C.-cm$^2$/W) | 0.013° C.-in$^2$/W (0.08° C.-cm$^2$/W) |
| Thermal conductivity | 3.8 W/mK | | | |
| Volume resistivity | 3.0 × 10$^{12}$ ohm-cm | | | |

| PROPERTIES | Tpcm ™ 780 | TEST METHOD |
|---|---|---|
| Color | Grey | Visual |
| Thickness, inches (mm) | 0.016" (0.406) 0.025" (0.635) | |
| Thickness Tolerance, inches (mm) | ±0.0016" (0.0406) ±0.0025 (0.0635) | |
| Construction & Composition | Non-reinforced film | |
| Specific Gravity, g/cc | 2.48 | Helium Pycnometer |
| Phase Change Softening Range, ° C. | ~45° C. to 70° C. | |
| Thermal Conductivity, W/mK | 9.4 | Hot Disk Thermal Constants Analyzer |
| Hardness (Shore 00) | 85 3 sec @ 21 C. | ASTM D2240 |
| Thermal Resistance 70° C., 345 kPa, ° C.-cm$^2$/W (50 psi, ° C.-in$^2$/W) | 0.025 (0.004) | ASTM D5470 (modified) |
| Outgassing TML | 0.51% | ASTM E595 |
| Outgassing CVCM | 0.20% | ASTM E595 |

| | TPLI ™ 200 | TPLI ™ 220 | TPLI ™ 240 |
|---|---|---|---|
| Construction & Composition | Reinforced boron nitride filled silicone elastomer | Boron nitride filled silicone elastomer | Boron nitride filled silicone elastomer |
| Color | Rose | Blue | Yellow |
| Thickness | 0.010* (0.25 mm) | 0.020* (0.51 mm) | 0.040* (1.02 mm) |
| Thickness Tolerance | ±0.001* (±0.025 mm) | ±0.002* (±0.05 mm) | ±0.003* (±0.08 mm) |
| Density | 1.44 g/cc | 1.43 g/cc | 1.43 g/cc |
| Hardness | 75 Shore 00 | 70 Shore 00 | 70 Shore 00 |
| Tensile Strength | N/A | 35 psi | 35 psi |
| % Elongation | N/A | 5 | 5 |
| Outgassing TML (Post Cured) | 0.08% | 0.07% | 0.07% |
| Outgassing CVCM (Post Cured) | 0.03% | 0.02% | 0.02% |
| UL Flammability Rating | 94 HB | 94 HB | 94 HB |
| Temperature Range | −45° C. to 200° C. | −45° C. to 200° C. | −45° C. to 200° C. |
| Thermal Conductivity | 6 W/mK | 6 W/mK | 6 W/mK |
| Thermal Impedance @ 20 psi @ 138 KPa | 0.16° C.·in$^2$/W 1.03° C.·cm$^2$/W | 0.21° C.·in$^2$/W 1.35° C.·cm$^2$/W | 0.37° C.·in$^2$/W 2.45° C.·cm$^2$/W |
| Thermal Expansion | 51 ppm/C. | 123 ppm/C. | 72 ppm/C. |
| Breakdown Voltage | 1,000 Volts AC | 4,000 Volts AC | >5,000 Volts AC |

-continued

| | | | |
|---|---|---|---|
| Volume Resistivity | 5 × 10¹³ ohm · cm | 5 × 10¹³ ohm · cm | 5 × 10¹³ ohm · cm |
| Dielectric Constant @ 1 MHz | 3.21 | 3.21 | 3.26 |

| | TPLI ™ 260 | TPLI ™ 2100 | TEST METHOD |
|---|---|---|---|
| Construction & Composition | Boron nitride filled silicone elastomer | Boron nitride filled silicone elastomer | |
| Color | Grey | Grey | Visual |
| Thickness | 0.060* (1.52 mm) | 0.100* (2.54 mm) | |
| Thickness Tolerance | ±0.004* (±0.10 mm) | ±0.007* (±0.18 mm) | |
| Density | 1.38 g/cc | 1.36 g/cc | Helium Pycnometer |
| Hardness | 70 Shore 00 | 70 Shore 00 | ASTM D2240 |
| Tensile Strength | 20 psi | 15 psi | ASTM D412 |
| % Elongation | 5 | 5 | ASTM D412 |
| Outgassing TML (Post Cured) | 0.10% | 0.15% | ASTM E595 |
| Outgassing CVCM (Post Cured) | 0.04% | 0.07% | ASTM E595 |
| UL Flammability Rating | 94 HB | 94 HB | E180840 |
| Temperature Range | −45° C. to 200° C. | −45° C. to 200° C. | |
| Thermal Conductivity | 6 W/mK | 6 W/mK | ASTM D5470 (modified) |
| Thermal Impedance @ 20 psi @ 138 KPa | 0.49° C. · in²/W 3.35° C. · cm²/W | 0.84° C. · in²/W 5.81° C. · cm²/W | ASTM D5470 (modified) |
| Thermal Expansion | 72 ppm/C. | 96 ppm/C. | IPC-TM-650 2.4.24 |
| Breakdown Voltage | >5,000 Volts AC | >5,000 Volts AC | ASTM D149 |
| Volume Resistivity | 5 × 10¹³ ohm · cm | 5 × 10¹³ ohm · cm | ASTM D257 |
| Dielectric Constant @ 1 MHz | 3.26 | 3.4 | ASTM D150 |

| TFLEX ™ 300 TYPICAL PROPERTIES | | |
|---|---|---|
| | TFLEX ™ 300 | TEST METHOD |
| Construction | Filled silicone elastomer | NA |
| Color | Light green | Visual |
| Thermal Conductivity | 1.2 W/mK | ASTM D5470 |
| Hardness (Shore 00) | 27 (at 3 second delay) | ASTM D2240 |
| Density | 1.78 g/cc | Helium Pyncometer |
| Thickness Range | 0.020″-.200″ (0.5-5.0 mm)* | |
| Thickness Tolerance | ±10% | |
| UL Flammability Rating | 94 V0 | UL |
| Temperature Range | −40° C. to 160° C. | NA |
| Volume Resistivity | 10¯13 ohm-cm | ASTEM D257 |
| Outgassing TML | 0.56% | ASTM E595 |
| Outgassing CVCM | 0.10% | ASTM E595 |
| Coefficient Thermal Expansion (CTE) | 600 ppm/C | IPC-TM-650 2.4.24 |

A TIM may include compliant or conformable silicone pads, non-silicone based materials (e.g., non-silicone based gap filler materials, thermoplastic and/or thermoset polymeric, elastomeric materials, etc.), silk screened materials, polyurethane foams or gels, thermal putties, thermal greases, thermally-conductive additives, etc. A TIM may be configured to have sufficient conformability, compliability, and/or softness to allow the TIM material to closely conform to a mating surface when placed in contact with the mating surface, including a non-flat, curved, or uneven mating surface. A TIM may comprise an electrically conductive soft thermal interface material formed from elastomer and at least one thermally-conductive metal, boron nitride, and/or ceramic filler, such that the soft thermal interface material is conformable even without undergoing a phase change or reflow. The TIM may be a non-metal, non-phase change material that does not include metal and that is conformable even without undergoing a phase change or reflow. A TIM may comprise a thermal interface phase change material, such as the T-pcm™ 583 listed in the above table.

A TIM may comprise one or more conformable thermal interface material gap filler pads having sufficient deformability, compliance, conformability, compressibility, flowability, and/or flexibility for allowing a pad to relatively closely conform to the size and outer shape of an electronic component when placed in contact with the electronic component when the shielding apparatus is installed to a printed circuit board over the electronic component. By engaging an electronic component in a relatively close fitting and encapsulating manner, a conformable thermal interface material gap pad may conduct heat away from the electronic component to the cover in dissipating thermal energy. Also, the thermal interface material gap filler pad may be a non-phase change material and/or be configured to adjust for tolerance or gap by deflecting.

In some exemplary embodiments, the thermal interface material may comprises a non-phase change gap filler, gap pad, or putty that is conformable without having to melt or undergo a phase change. The thermal interface material may be able to adjust for tolerance or gaps by deflecting at low temperatures (e.g., room temperature of 20° C. to 25° C., etc.). The thermal interface material may have a Young's modulus and Hardness Shore value considerably lower than copper or aluminum. The thermal interface material may also have a greater percent deflection versus pressure than copper or aluminum.

In some exemplary embodiments, the thermal interface material comprises T-flex™ 300 ceramic filled silicone elastomer gap filler or T-flex™ 600 boron nitride filled silicone elastomer gap filler which both have a Young's modulus of about 0.000689 gigapascals. Accordingly, exemplary embodiments may include thermal interface materials having a Young's module much less than 1 gigapascal.

T-flex™ 300 ceramic filled silicone elastomer gap filler and T-flex™ 600 boron nitride filled silicone elastomer gap filler have a Shore 00 hardness value (per the ASTMD2240 test method) of about 27 and 25, respectively. In some other exemplary embodiments, the thermal interface material may comprise T-pli™ 200 boron nitride filled, silicone elastomer, fiberglass reinforced gap filler having a Shore 00 hardness of about 70 or 75. Accordingly, exemplary embodiments may include thermal interface materials having a Shore 00 hardness less than 100.

In addition, some exemplary embodiments include a conformable thermal interface that will wet and adhere to a mating surface. Examples of compliant or conformable thermal interface materials that may be used in exemplary embodiments are set forth immediately below, along with their Young's modulus, thermal conductivity, and hardness values.

silicone elastomer, which recover to over 90% of their original thickness after compression under low pressure (e.g., 10 to 100 pounds per square inch, etc.), have a hardness of 25 Shore 00 or 40 Shore 00 per ASTM D2240, and other properties as shown in table herein. Tpli™ 200 series gap fillers generally include reinforced boron nitride filled silicone elastomer, have a hardness of 75 Shore 00 or 70 Shore 00 per ASTM D2240, and other properties as shown in tables herein. Tpcm™ 580 series phase change materials are generally non-reinforced films having a phase change softening temperature of about 122 degrees Fahrenheit (50 degrees Celsius). Tgrease™ 880 series thermal grease is generally a silicone-based thermal grease having a viscosity of less than 1,500,000 centipoises. Other exemplary embodiments may include a TIM with a hardness of less 25 Shore 00, greater than 75 Shore 00, between 25 and 75 Shore 00, etc.

Some of the example embodiments of the present disclosure may provide one or more (but not necessarily any or all) of the following advantages. For example, exemplary embodiments may have an overall thickness of less than about one millimeter (e.g., about 0.7 mm, about 0.75 mm, etc.). Exemplary embodiments may be mounted, applied, or installed to non-flat surfaces and/or may be designed or provided in three dimensional surfaces or patterns. Exemplary embodiments may allow for relative ease of operation, manufacture, and rework and/or be relatively low cost. With exemplary embodiments, an overall thickness of a BLS may be reduced (e.g., by 0.07 mm, by 0.25 mm, etc.), which, in turn, would allow reductions in thickness of the device in which the BLS is used.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope

| Name | Construction Composition | Type | Young's Modulus (gigapascals) | Thermal Conductivity W/mK | Hardness |
| --- | --- | --- | --- | --- | --- |
| T-flex ™ 320 | Ceramic filled silicone elastomer | Gap Filler | .000689 | 1.2 | 56 Shore 00 |
| T-flex ™ 620 | Reinforced boron nitride filled silicone elastomer | Gap Filler | .000689 | 3 | 40 Shore 00 |
| T-flex ™ 640 | Boron nitride filled silicone elastomer | Gap Filler | .000379 | 3 | 25 Shore 00 |
| T-flex ™ 660 | Boron nitride filled silicone elastomer | Gap Filler | .00031 | 3 | 25 Shore 00 |
| T-flex ™ 680 | Boron nitride filled silicone elastomer | Gap Filler | .000276 | 3 | 25 Shore 00 |
| T-flex ™ 6100 | Boron nitride filled silicone elastomer | Gap Filler | .000227 | 3 | 25 Shore 00 |

T-flex™ 300 series thermal gap filler materials generally include, e.g., ceramic, filled silicone elastomer which will deflect to over 50% at pressures of 50 pounds per square inch and other properties shown below. T-flex™ 600 series thermal gap filler materials generally include boron nitride filled of the disclosure. In some example embodiments, well-known processes, well-known device structures, and well-known technologies are not described in detail. In addition, advantages and improvements that may be achieved with one or more exemplary embodiments of the present disclosure are provided for purposes of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (e.g., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A multipiece shielding apparatus comprising:
   a frame comprising electrically-conductive foam that comprises plated foam; and
   a cover attachable to the frame;
   whereby the multipiece shielding apparatus is operable for shielding one or more components on a substrate when the one or more components are within an interior cooperatively defined by the frame and the cover attached to the frame;
   wherein:
      the multipiece shielding apparatus has a height of less than one millimeter;
      the electrically-conductive foam has a flame rating of UL94 V-0;
      the electrically-conductive foam has no more than a maximum of 900 parts per million chlorine, no more than a maximum of 900 parts per million bromine, and no more than a maximum of 1,500 parts per million total halogens; and
      the cover has no more than a maximum of 900 parts per million chlorine, no more than a maximum of 900 parts per million bromine, and no more than a maximum of 1,500 parts per million total halogens.

2. The multipiece shielding apparatus of claim 1, wherein:
   the frame includes one or more sidewalls defined by the electrically-conductive foam such that the frame has an open top; and
   the cover is coupled to the frame such that the open top of the frame is covered by the cover; and
   the one or more sidewalls comprise polyurethane foam plated with metal.

3. The multipiece shielding apparatus of claim 2, wherein the sidewalls are integrally defined by a single piece of the electrically-conductive foam.

4. The multipiece shielding apparatus of claim 3, wherein the sidewalls have a single-piece or unitary construction such that the frame does not include any gaps between adjacent pairs of the sidewalls and/or joints connecting separate sidewalls to each other.

5. The multipiece shielding apparatus of claim 3, wherein the single piece of electrically-conductive foam is die cut from an electrically-conductive foam sheet into a shape of the frame.

6. The multipiece shielding apparatus of claim 1, wherein the frame comprises multiple foam strips of the electrically-conductive foam including one foam strip shaped to define outermost sidewalls of the frame and at least one other foam strip defining at least one interior wall of the frame.

7. The multipiece shielding apparatus of claim 1, wherein the frame comprises one or more outer sidewalls and one or more interior walls defined by the electrically-conductive foam such that the cover and the frame's sidewalls and interior walls cooperatively define a plurality of individual EMI shielding compartments, whereby when the frame is installed to a substrate, components of the substrate are positionable in different compartments and are provided with EMI shielding by virtue of the EMI shielding compartments inhibiting the ingress and/or egress of EMI into and/or out of each EMI shielding compartment.

8. The multipiece shielding apparatus of claim 1, wherein:
the cover is attached to a first side of the frame; and
the shielding apparatus further comprises an electrically-conductive pressure sensitive adhesive tape coupled to a second side of the frame opposite the first side to which the cover is attached, the electrically-conductive pressure sensitive adhesive tape having a peel strength on stainless steel of greater than 1.3 kilogram force per 25 millimeters and/or a Z-axis resistance of less than 0.05 ohms.

9. The multipiece shielding apparatus of claim 1, wherein the electrically-conductive foam comprises a polyurethane foam plated with metal on a body of the polyurethane foam.

10. The multipiece shielding apparatus of claim 1, wherein the electrically-conductive foam comprises internal surfaces which are electrically conductive due to at least one electrically conductive layer plated on the internal surfaces.

11. The multipiece shielding apparatus of claim 1, wherein the cover comprises an electrically-conductive fabric tape including Nickel/Copper polyester based fabric and an electrically-conductive pressure sensitive adhesive.

12. The multipiece shielding apparatus of claim 1, wherein the cover comprises at least one of an electrically-conductive fabric, a metalized clear film, or an electrically-conductive foam.

13. The multipiece shielding apparatus of claim 1, wherein the frame consists only of the electrically-conductive foam.

14. The multipiece shielding apparatus of claim 1, wherein the electrically-conductive foam comprises foam plated with metal.

15. The multipiece shielding apparatus of claim 1, wherein the electrically-conductive foam comprises foam plated with metal on a whole body of the foam.

16. The multipiece shielding apparatus of claim 1, wherein the cover comprises electrically-conductive foam, which is the same as the electrically-conductive foam of the frame.

17. The multipiece shielding apparatus of claim 1, wherein the cover comprises electrically-conductive foam, which is different than the electrically-conductive foam of the frame.

18. The multipiece shielding apparatus of claim 1, wherein the electrically-conductive foam has a compression set less than 25%.

19. The multipiece shielding apparatus of claim 1, wherein the cover has a surface resistivity of less than about 0.1 ohms/square.

20. The multipiece shielding apparatus of claim 1, wherein the cover comprises an electrically-conductive layer, an adhesive layer, and a release paper layer.

21. The multipiece shielding apparatus of claim 1, further comprising a thermal interface material disposed along an inner surface of the cover, such that the thermal interface material is placed is contact with at least one heat source when the multipiece shielding apparatus is installed to a printed circuit board over the heat source, whereby a thermally-conductive heat path is defined from the heat source through the thermal interface material to the cover.

22. A method of making the multipiece shielding apparatus of claim 1, comprising:
forming electrically-conductive foam walls of the frame that define an open top and that are configured for installation to a substrate generally about one or more components on a substrate; and
covering the open top with an electrically-conductive material of the cover, whereby the electrically-conductive foam walls and the electrically-conductive material are operable for shielding the one or more components on the substrate when the one or more components are within an interior cooperatively defined by the electrically-conductive foam walls and the electrically-conductive material.

23. The method of claim 22, wherein forming includes die-cutting the electrically-conductive foam walls from a single electrically-conductive foam sheet such that the electrically-conductive foam walls have a single-piece or unitary construction.

24. The method of claim 22, wherein the method includes using vacuum nests or vacuum boards for attaching the electrically-conductive material to the electrically-conductive foam walls over the open top.

25. A method relating to providing shielding for one or more components on a substrate, the method comprising:
attaching the cover to the frame of the multipiece shielding apparatus of claim 1; and
attaching the frame to the substrate such that the one or more components are disposed within an interior cooperatively defined by the frame and the cover.

26. A multipiece shielding apparatus comprising:
a frame comprising electrically-conductive foam that comprises plated foam; and
a cover attachable to the frame;
an electrically-conductive adhesive layer along a bottom of the frame;
a release liner over the electrically-conductive adhesive layer and configured to allow for a single removal of the release liner to expose the electrically-conductive adhesive layer along the bottom of the frame for adhesively attaching the frame to a substrate; and
a clear film adhesively attached along a top of the frame and operable as a stiffener for supporting the frame;
whereby the multipiece shielding apparatus is operable for shielding one or more components on a substrate when the one or more components are within an interior cooperatively defined by the frame and the cover attached to the frame.

27. The multipiece shielding apparatus of claim 26, wherein:
the clear film includes a tab for carrying the frame and for removing or peeling off the clear film from the frame; and/or
the clear film comprises a polyester film, a polyimide film, or a polyethylene naphthalate film.

28. The multipiece shielding apparatus of claim 26, wherein:
the multipiece shielding apparatus has a height of less than one millimeter;
the electrically-conductive foam has a flame rating of UL94 V-0;
the electrically-conductive foam has no more than a maximum of 900 parts per million chlorine, no more than a maximum of 900 parts per million bromine, and no more than a maximum of 1,500 parts per million total halogens; and the cover has no more than a maximum of 900 parts per million chlorine, no more than a maximum of 900 parts per million bromine, and no more than a maximum of 1,500 parts per million total halogens.

* * * * *